United States Patent [19]
Itou et al.

[11] Patent Number: 5,677,208
[45] Date of Patent: Oct. 14, 1997

[54] METHOD FOR MAKING FET HAVING REDUCED OXIDATION INDUCTIVE STACKING FAULT

[75] Inventors: Hiroyasu Itou, Nagoya; Hideya Inagaki, Kasugai, both of Japan

[73] Assignee: Nippondenso Co., Ltd., Kariya, Japan

[21] Appl. No.: 410,373

[22] Filed: Mar. 24, 1995

[30] Foreign Application Priority Data

Mar. 25, 1994 [JP] Japan .................. 6-055783

[51] Int. Cl.$^6$ .................................. H01L 21/265
[52] U.S. Cl. .................. 437/29; 437/34; 437/41; 437/56
[58] Field of Search .................. 437/56, 29, 57, 437/58, 34, 41 R, 41 RCM

[56] References Cited

U.S. PATENT DOCUMENTS

| | | | |
|---|---|---|---|
| 5,002,902 | 3/1991 | Watanabe | 437/235 |
| 5,091,332 | 2/1992 | Bohr et al. | 437/57 |
| 5,096,839 | 3/1992 | Amai et al. | 437/10 |
| 5,252,510 | 10/1993 | Lee et al. | 437/57 |
| 5,300,797 | 4/1994 | Bryant et al. | 437/34 |
| 5,304,510 | 4/1994 | Suguro et al. | 437/195 |

FOREIGN PATENT DOCUMENTS

| | | |
|---|---|---|
| 56-162850 | 12/1981 | Japan . |
| 4 364 57 | 6/1992 | Japan . |
| 5190850 | 7/1993 | Japan . |
| 05221786 | 8/1993 | Japan . |
| 61 2801 | 2/1994 | Japan . |

OTHER PUBLICATIONS

VLSI Manufacturing Technology article in Japanese (Jan. 14, 198, pp. 61–63) and partial translation.
Oxygen Precipitation and OSF article in Japanese and partial translation.

*Primary Examiner*—John Niebling
*Assistant Examiner*—Long Pham
*Attorney, Agent, or Firm*—Cushman, Darby & Cushman IP Group of Pillsbury Madison & Sutro LLP

[57] ABSTRACT

An improved manufacturing method for a semiconductor device, which can reduce process inductive fault such as oxidation inductive stacking fault (OSF) and contribute to the improvement of the electric characteristics of the semiconductor device, is disclosed. A thermal oxide film is formed on a semiconductor substrate, then a nitride film is formed and a medium temperature heat treatment is provided to the semiconductor substrate within a temperature range from 600° C. to 1,000° C., whereby an interstitial oxygen concentration can be lowered. Subsequently, ion implantation, etc. are provided as a well region forming process, and a drive-in process is performed by means of a high temperature heat treatment. At this time, ion implantation dose is set to $9 \times 10^{13}$ [cm$^{-2}$] or less, and the temperature of the heat treatment is lowered or the duration of the teat treatment is shortened. After this, an element separation layer process is performed, and a gate oxide film, a gate electrode, a source/drain layer, a CVD oxide film, a contact hole and a metal wire are formed.

25 Claims, 26 Drawing Sheets

METHOD FOR MAKING FET HAVING REDUCED OXIDATION INDUCTIVE STACKING FAULT

CROSS REFERENCE TO RELATED APPLICATION

This application is based upon and claims the benefit of priority of the prior Japanese Patent application No. 6-55783 filed on Mar. 25, 1994, the contents of which are incorporated herein by reference.

BACKGROUND OF THE INVENTION

1. Field of the Invention

The present invention generally relates to a manufacturing method for a semiconductor device. More particularly, the present invention relates to a manufacturing method for a semiconductor device in which a deep junction is formed by providing a high temperature heat treatment after ion implantation.

2. Related Arts

In a semiconductor device using a silicon as a semiconductor, particularly in a MOS type semiconductor device, the micronization of elements has been promoted in order to comply with higher integration thereof. The micronization of elements requires a thinner gate oxide film and a higher impurity concentration as well as a shorter gate/channel length.

On the other hand, the micronization of elements reveals the initial faults and potential faults and degrades the characteristics of elements. Particularly in a MOS type semiconductor device which uses the substrate surface region as an active region, the revelation of surface faults directly contributes to the degradation of the characteristics of elements of the MOS type semiconductor device.

The crystalline defects which cause the degradation of the characteristics of elements is roughly divided into three types of faults: (1) fault caused by the crystal of a silicon which becomes a substrate (crystal inductive fault); (2) fault caused by the contamination with a heavy metal during the manufacturing process for a semiconductor device (contamination inductive fault); and (3) fault caused by any cause other than the (1) and (2) above during the manufacturing process for a semiconductor device (process causing fault, hereinafter referred to as the "process inductive fault").

Here, as the semiconductor device manufacturing process, a typical example of the manufacturing process flow chart for a MOS type semiconductor device manufacturing process flow chart is illustrated in FIG. 20, and details of a well region forming process and an element separation layer forming process are illustrated in FIGS. 21A and 21B, respectively.

The outline of the manufacturing process for a MOS type semiconductor device manufacturing process will be described. Firstly, on a silicon substrate 1 (FIG. 22A) is formed a thermal oxide film 2 (FIG. 22B: corresponding to thermal oxide film forming process of FIG. 20). Then, a well region forming process shown in FIG. 21A is performed. In the well region forming process: a mask for forming a P-well region 4 is formed by performing a photolithography process, for example; specified impurity ions such as boron ions are implanted into a specified region; the thermal oxide film 2 is etched according to the formed mask to form a first alignment mark 17; a resist used as a mask material is removed; specified impurity ions such as phosphorous ions for forming an N-well region 5 are implanted into a specified region; the substrate 1 is washed; a high temperature heat treatment is performed on a wafer shown in FIG. 22C to form deep junctions called "P-well region 4" and "N-well region 5"; and the thermal oxide film 2 is removed (see FIG. 22D).

In the following element separation layer forming process, the processes illustrated in FIG. 21B are performed. Specifically, a thermal oxide film 6 and a nitride film 7 are formed, the photolithography process and the etching process are performed by using the first alignment mark 17, a mask for thermal oxidation is formed on the silicon substrate 1 by patterning only the nitride film 7, and the resist is removed (see FIG. 22E). After the thermal oxidation process, a thick thermal oxide film 8 is locally formed as an element separation region on the surface of the silicon substrate 1 by removing the nitride film 7 and the thermal oxidation film 6. Incidentally, because of the pattern of the nitride film 7, a second alignment mark 18 which is a position detecting mark required in the subsequent photolithography process is formed (see FIG. 22F).

Then, the normal MOS process, i.e., from gate oxide film forming process to metal wiring forming process of FIG. 20, is performed to form a transistor. Specifically, a gate oxide film 9 and a gate electrode 10 are formed, specified ions necessary for forming a shallow junction called "source/drain layer" are implanted into a specified region, a CVD oxide film 15 is formed, and a reflow process which is a medium temperature heat treatment is provided to form the source/drain layers (11, 12, 13 and 14 in FIG. 22G). Following this, a contact hole is made and a metal wiring 16 is formed to complete the manufacture of the MOS type semiconductor device illustrated in FIG. 22G.

However, in the above conventional manufacturing method for a semiconductor device, as a plurality of heat treatment processes, ion implantation processes and micronization processes are repeated to form a semiconductor device, faults as described below may be caused.

As a process inductive fault in the manufacturing method for a semiconductor device, there are three types of faults: a crystalline defect such as dislocation due to localized stress caused to a silicon substrate during the manufacturing process; a crystalline defect such as dislocation caused to a junction region due to the ion implanting process; and a micro-defect caused after the thermal oxidation. As these process inductive faults largely depend on the manufacturing process for a semiconductor device, there are many uncertain parts about the real cause.

On the other hand, as a countermeasures to prevent the occurrence of stacking fault such as a surface oxidation inductive stacking fault (hereinafter referred to as the "surface OSF") and a bulk stacking fault among the above micro faults, a high temperature heat treatment at a temperature of 1,100° C. or more has been recommended.

However, in the conventional manufacturing process, also in a MOS type semiconductor device manufactured by providing a high temperature heat treatment at a temperature of 1,150° C. or more, it was confirmed that the surface OSF had occurred all over the transistor forming region as well as the source/drain region implanted with ions at a high dose (e.g., ion implantation dose $=5\times10^{15}$ [pieces/cm$^2$]). The element characteristic degradation due to the surface OSF has been a problem.

SUMMARY OF THE INVENTION

In view of the above, it is a primary object of the present invention to provide an improved manufacturing method for a semiconductor device which can reduce the process inductive faults such as the surface OSF and contribute to the improvement of the electric characteristics of the semiconductor device.

In order to achieve the above objective, a method for forming a semiconductor device according to the present invention comprises a thermal oxide film forming process for forming a thermal oxide film on the surface of a semiconductor substrate, an interstitial oxygen concentration lowering process including a medium temperature heat treatment within a range from 600° C. to 1,000° C. for lowering the interstitial oxygen concentration within the semiconductor substrate, an ion implanting process for implanting ions into a specified region of the semiconductor substrate, a junction forming process for forming a deep junction within the semiconductor substrate by providing a high temperature heat treatment at a temperature of over 1,100° C., and a transistor forming process for forming a transistor by using the deep junction.

In the above interstitial oxygen concentration lowering process, it may be so arranged that a thin film having the selectivity of etching against the thermal oxide film is formed and then the medium temperature heat treatment is performed.

The above interstitial oxygen concentration process may also be a process for forming a thin film to be provided within a film forming temperature range from 600° C. to 1,000° C.

The thin film may be used as a position detecting mark for use in the transistor forming process by providing patterning thereto.

Furthermore, the present invention may be a manufacturing method comprising a thermal oxide film forming process for forming a thermal oxide film on the surface of a semiconductor substrate, an ion implanting process for implanting ions at $9 \times 10^{13}$ [pieces/cm$^2$] or less into a specified region of the semiconductor substrate, a junction forming process for forming a deep junction, the depth of which is reduced, within the semiconductor substrate by providing a high temperature heat treatment of over 1,000° C., and a transistor forming process for forming a transistor by using the deep junction.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Figure 4:
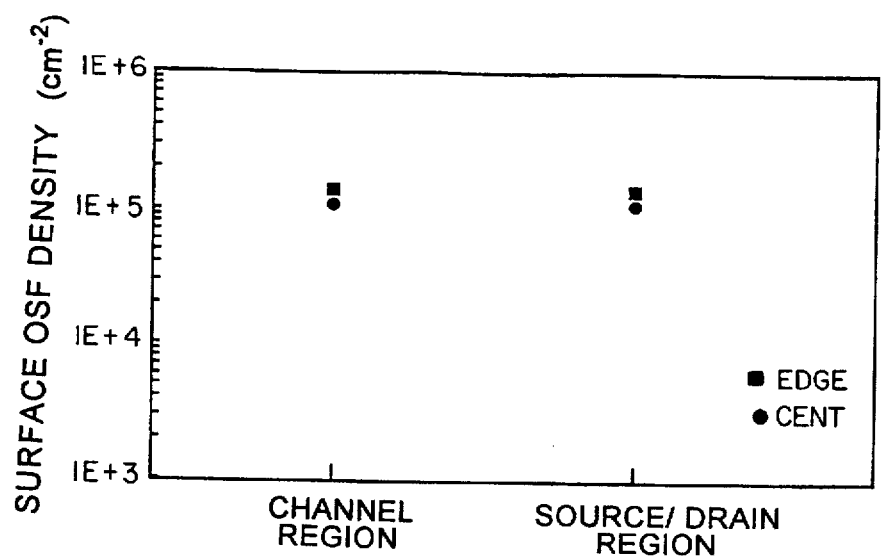
FIG. 4 is a graph showing the comparison of the surface OSF density of a MOS type semiconductor device.
Figure 5:
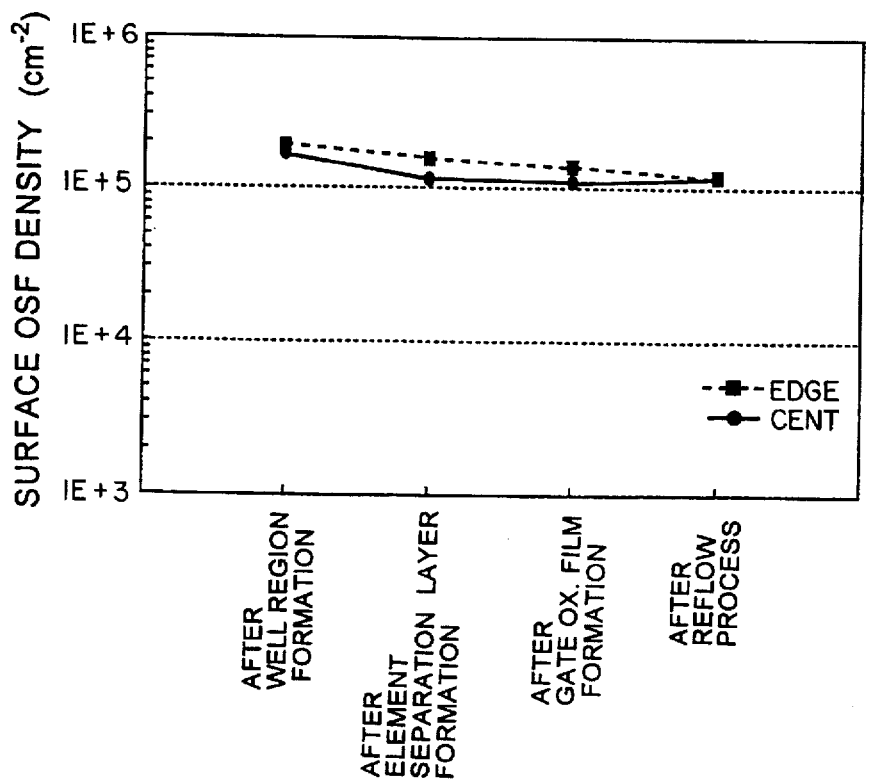
FIG. 5 is a graph showing the transition in the surface OSF density during the manufacturing processes of a MOS type semiconductor device.
Figure 20:
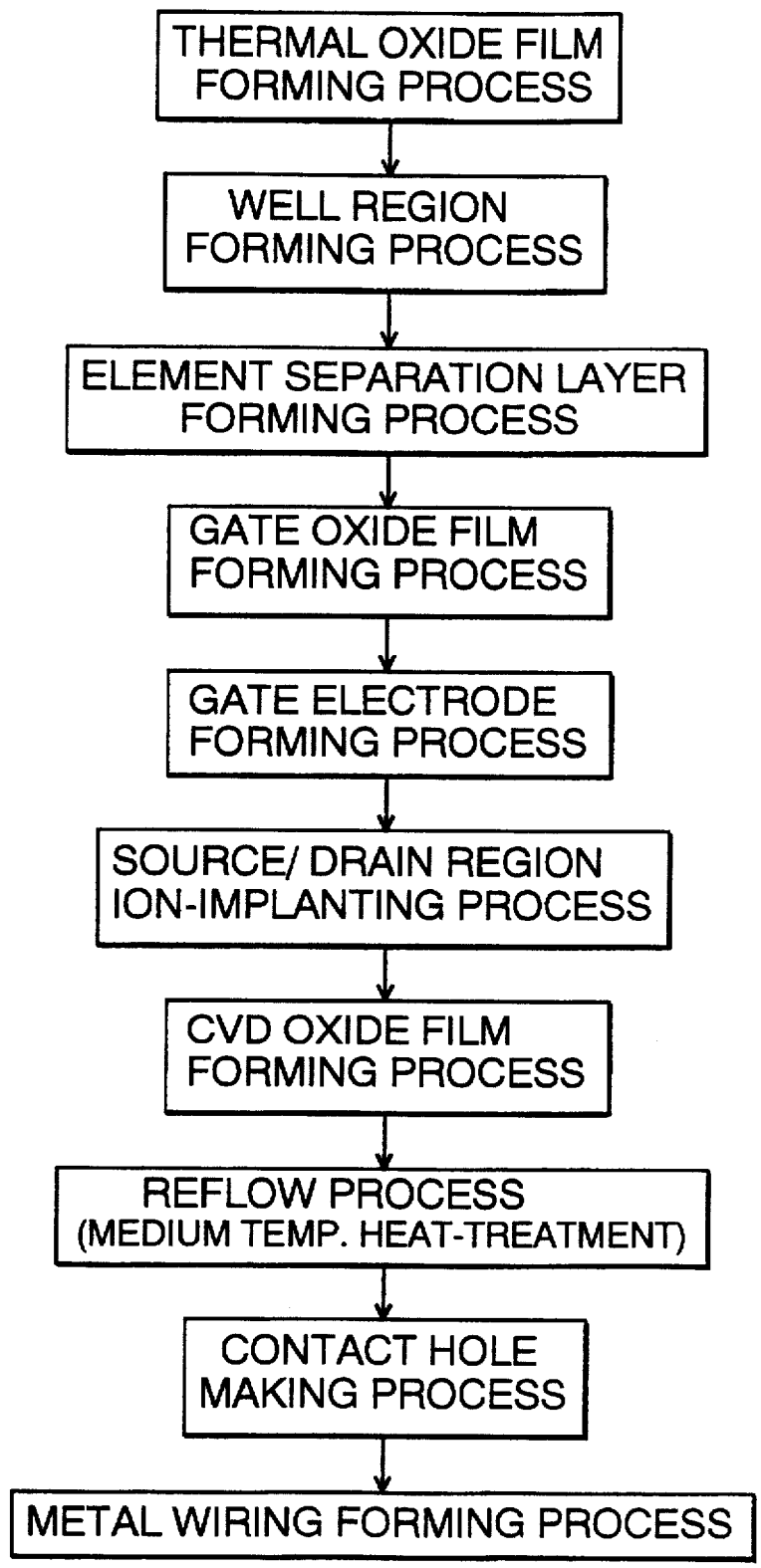
FIG. 20 is a process flow chart illustrating the conventional manufacturing method for a MOS type semiconductor.
Figure 21A:
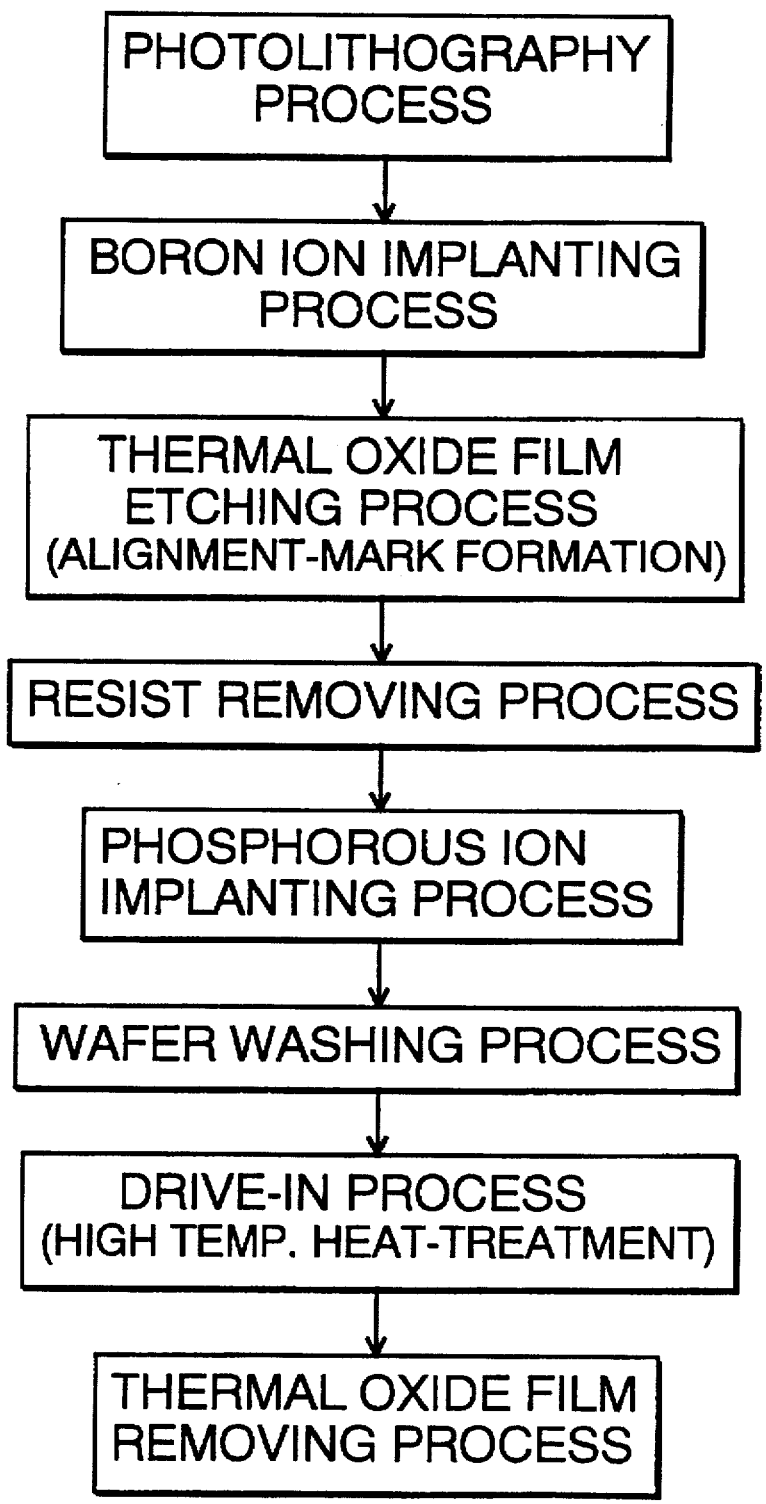
FIGS. 21A and 21B are process flow charts specifically illustrating a well region forming process and an element separation layer forming process, respectively, in the conventional manufacturing method for a MOS type semiconductor device.
Figure 21B:
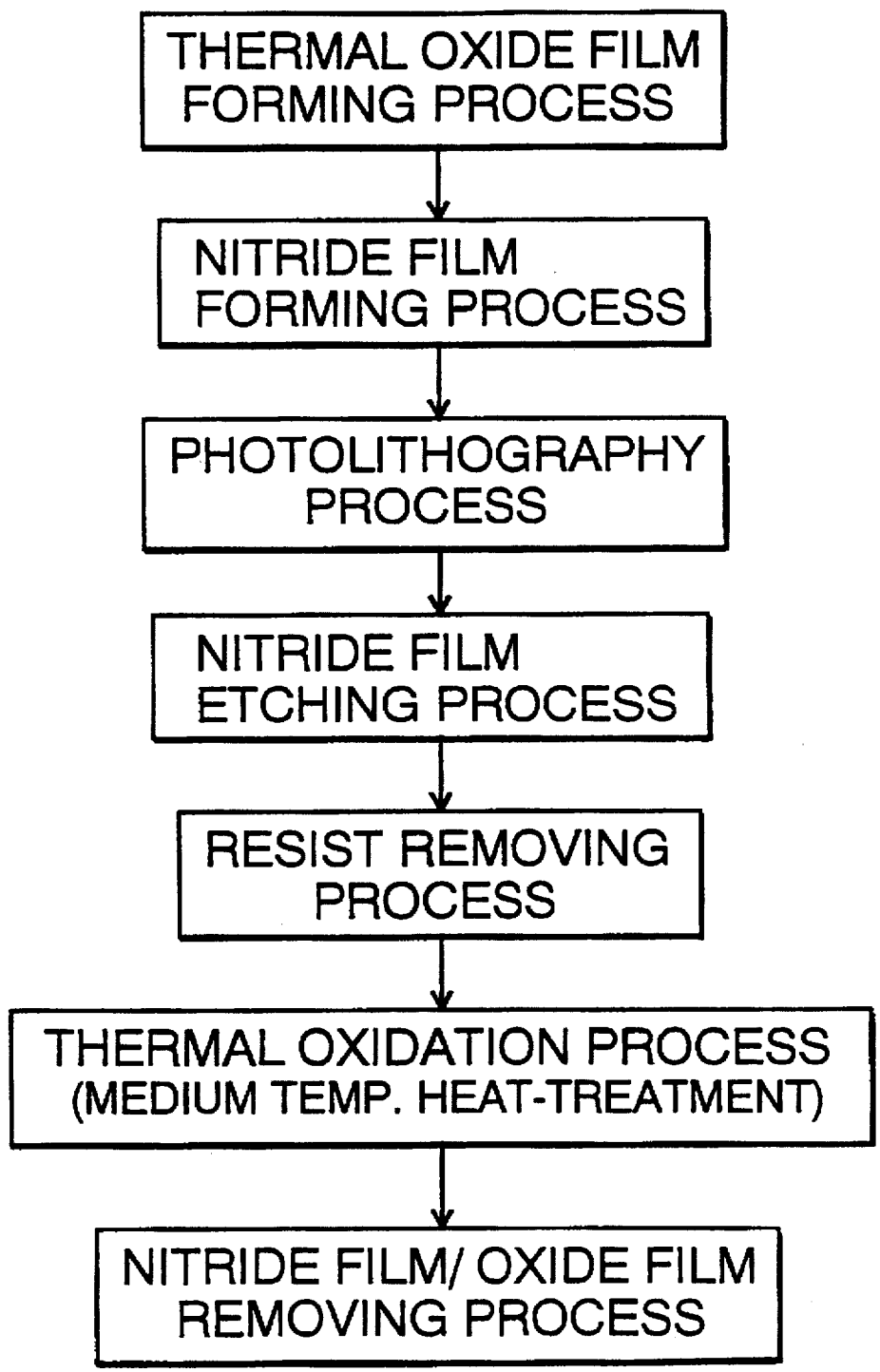
Figure 22A:
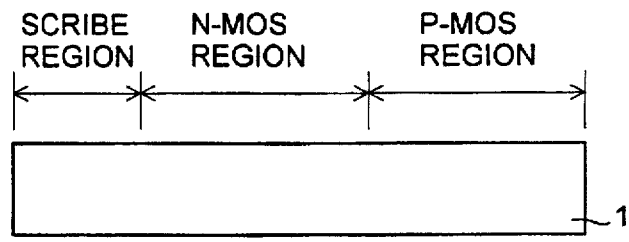
FIGS. 22A through 22G are cross-sectional views of a silicon wafer at the main processes of the conventional manufacturing process.
Figure 22B:
Figure 22C:
Figure 22D:
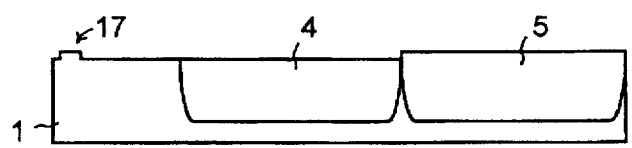
Figure 22E:
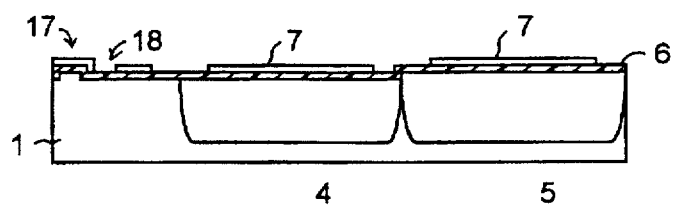
Figure 22F:
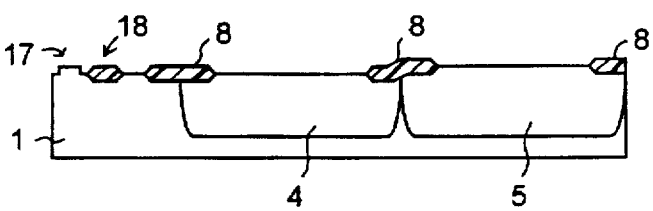
Figure 22G:
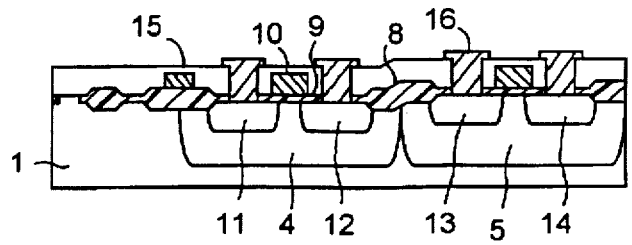

According to the manufacturing method for a conventional MOS semiconductor device as illustrated in process flow charts given in FIGS. 20, 21A and 21B, the inventors of the present invention investigated the surface OSF occurrence step illustrated in FIG. 4. As a result, as showing in FIG. 5, it was found that the surface OSF (oxidation inductive stacking fault) occurred after the well region forming process for forming a deep junction and that the surface OSF density remained unchanged even after the subsequent processes.

Also found was that the surface OSF did not occur on the surface of a silicon substrate to which only the drive-in process (high temperature heat treatment) had been provided without ion implanting process during the well region forming process and that this surface OSF was a process inductive crystal fault due to the ion implantation.

In FIGS. 20 and 21A, the drive-in process in the well region forming process is the above high temperature heat treatment process to be provided at 1,100° C. or more, and an intrinsic gettering (IG) process in the silicon substrate is also a process in which interstitial oxygen (Oi) existing within the silicon substrate diffuses to the outside of the silicon substrate (=external diffusion).

On the other hand, it is generally considered that the OSF is a coherence of interstitial silicon (SiI) centered around a core generated by some localized deformation, wherein the SiI is generated when a reaction expressed by the following equation progresses.

$$2Si + O \rightarrow SiO_2 + SiI \qquad (1)$$

Figure 6:
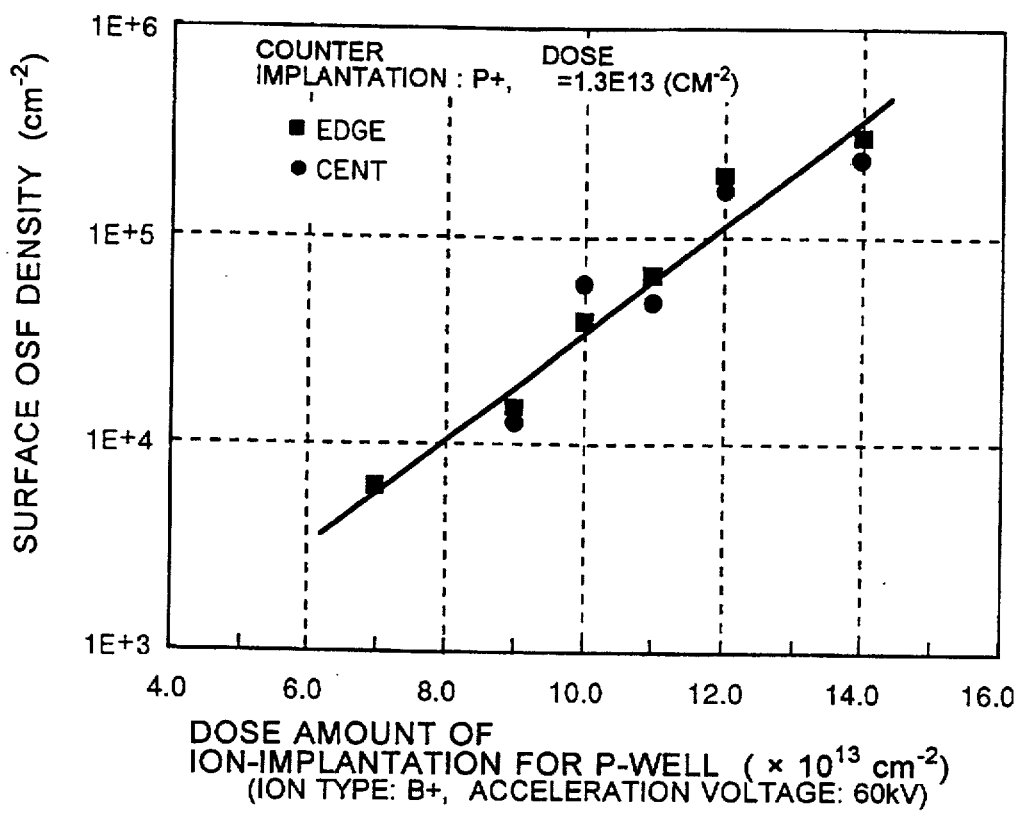
FIG. 6 is a graph showing the relationship between the ion implantation dose during the well region formation and the surface OSF density.

As another example, the relation between the implantation dose of boron ions and the surface OSF density when a P-well region 4 is formed by a manufacturing method according to the process flow charts given in FIGS. 20 and 21A is shown in FIG. 6. Here, in this manufacturing method, the implantation dose of phosphorus ions to be implanted into the P-well region 4 before the drive-in process was set to $1.3 \times 10^{13}$ [pieces/cm$^2$].

As evident from FIG. 6, the inventors of the present invention found that the surface OSF density depended on the ion implantation dose.

From the above, it can be estimated that the process inductive surface OSF is caused by an action of implantation deformation caused by ion implantation during the external diffusion stage of the interstitial oxygen Oi and that the implantation deformation which is one of the causes of the surface OSF depends on the ion implantation dose.

With respect to the Oi concentration within the silicon substrate, which is another cause of the surface OSF, the initial concentration can be lowered within a silicon substrate formed by the floating zone (FZ) method by approximately two digits compared with a silicon substrate formed by the Czochralski (CZ) method. However, as the Oi precipitates on the dislocation surface and stops the dislocating movement as a function thereof, the Oi is expected to control the occurrence of the dislocation due to thermal stress and prevent the warp of the silicon substrate. For this reason, generally, the silicon substrate formed by the CZ method with the high initial Oi concentration is used for the manufacture of a normal semiconductor device. Accordingly, the initial Oi concentration within the silicon substrate can freely be fixed. (Generally, the Oi concentration is set to $1 \times 10^{18}$ to $2 \times 10^{18}$ [atoms/cm$^3$].)

Figure 7:
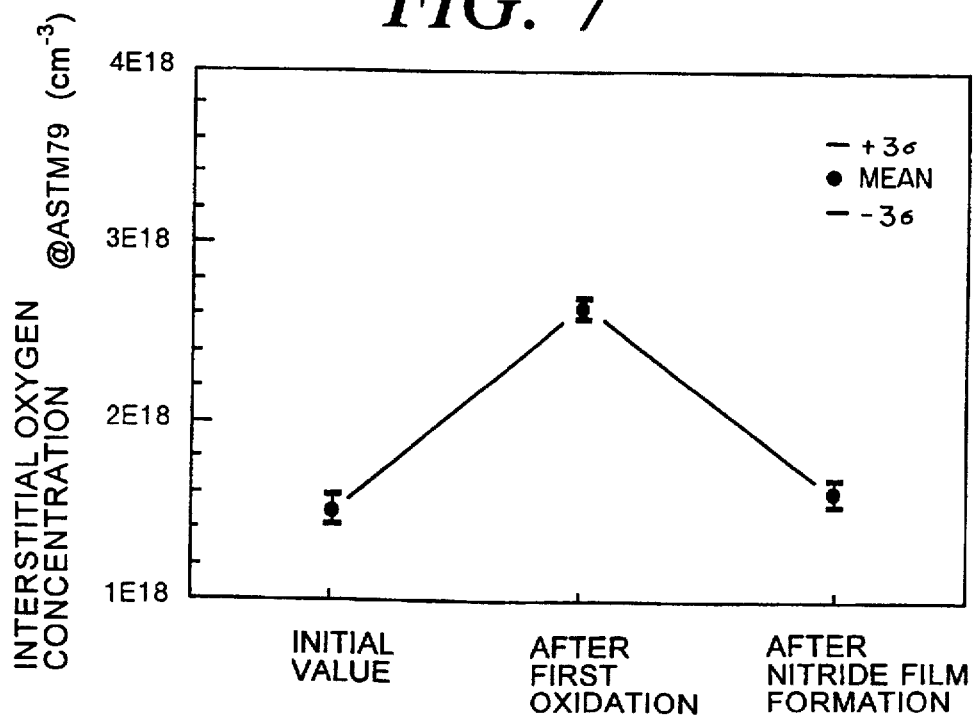
FIG. 7 is a graph showing the transition in the interstitial oxygen concentration according to the process.

On the other hand, the inventors of the present invention found in the oxidation process for forming a thermal oxidation film 2 (general film thickness: approximately 100 nm) for use in forming a position detecting mark required in a photolithography process in the manufacturing process of a MOS type semiconductor device according to the process flow charts given in FIGS. 20 and 21A that the Oi concentration rose during the oxidation process as shown in FIG. 7 (measured by the FT-IR method).

Furthermore, the inventors of the present invention found that the Oi concentration risen during the forming process of the thermal oxidation film 2 could be reduced to nearly the initial value either (1) by forming a thin film having the selectivity of etching to the thermal oxidation film 2 to form the position detecting mark and provide a medium temperature heat treatment within a temperature range from 600° C. to 1,000° C. or (2) by forming a thin film (e.g., nitride film by the low pressured CVD method) having the selectivity of etching to the thermal oxidation film 2 and also having the necessity of medium temperature heat treatment during the film making process.

The fall in the Oi concentration is considered to be caused by the transformation of oxygen taken into the interstitial position of the silicon lattice into a subtle silicon oxide by having the oxygen deposit through the medium temperature heat treatment. In this medium temperature heat treatment, the temperature may preferably be a half or more than the half of the melting point of the silicon (i.e., 600° C.) in order to secure the temperature at which the Oi can easily move.

In the above MOS type semiconductor device manufacturing method, the process inductive fault represented by the surface OSF can be reduced by reducing or controlling either or both the causes of the surface OSF, i.e., the implantation deformation caused by the ion implantation and the rise in the Oi concentration, before the high temperature heat treatment (drive-in process) for the formation of a deep junction (well region). As a result, the electric characteristics of the MOS type semiconductor can be improved. In the following passages, the mode of operation and effect of the specific means tried based on the results of experiments by the inventors of the present invention will be described.

In the MOS type semiconductor device manufacturing method according to the present invention, as a specific means for reducing the Oi concentration risen during the thermal oxide film formation formed before the above high temperature heat treatment, the interstitial oxygen concentration lowering process is performed for lowering the Oi concentration within the semiconductor substrate by providing the medium temperature heat treatment within a temperature range from 600° C. to 1,000° C. after the formation of the thermal oxide film on the silicon substrate (first aspect). As a result of this process, the Oi concentration risen during the formation of the thermal oxide film can be lowered.

Also, a thin film having the selectivity of etching to the thermal oxide film is formed after the thermal oxide film forming process, and subsequently the above interstitial oxygen concentration lowering process is performed within a temperature range from 600° C. to 1,000° C. (second aspect). As a result, the thin film can be formed without raising the Oi concentration.

Further, a thin film is formed within a film formation temperature range from 600° C. to 1,000° C. during the thin film forming process (third aspect). As a result, a process corresponding to the above first aspect of interstitial oxygen concentration lowering process can be performed, whereby the Oi concentration risen during the thermal oxide film formation can be lowered.

Next, the position detecting mark is formed with the thin films formed in the second and third aspects is formed, and according to this position detecting mark, a transistor is formed within a specified region (fourth aspect). As a result, there is no need to provide any special heat treatment or other treatment during the formation of the position detecting mark and the rise in the Oi concentration can be controlled.

As a specific means for reducing the above implantation deformation for controlling the occurrence of the surface OSF, the ion implantation dose is set to $9 \times 10^{13}$ [pieces/cm$^2$]

or less (fifth aspect). As a result, against the rise in the impurity concentration according to the micronization of the MOS type semiconductor device, not only the ion implantation dose is increased during the deep junction formation with a specified concentration but also the depth of the deep junction is reduced, i.e., the treatment duration or temperature of the high temperature heat treatment is shortened or lowered (sixth aspect). As a result, the ion implantation dose necessary for the formation of the deep junction with a specified concentration can be reduced and thereby the implantation deformation can also be reduced.

Furthermore, in the manufacturing method for a MOS type semiconductor device, when a process for removing the thermal oxide film formed before the deep junction formation is provided after the junction forming process (seventh aspect), the external diffusion of the implanted ions to the outside of the semiconductor caused during the high temperature heat treatment in the junction forming process can be controlled. As a result, the implantation deformation can further be reduced by the reduction in the ion implantation dose necessary for the formation of the deep junction with a specified concentration.

In addition to the above, one type of ions of the same conductivity type as the deep junction are implanted into the region where the deep junction is formed without implanting ions of the inverse conductivity type thereinto (eighth aspect). As a result, the ion implantation dose necessary for the formation of the deep junction can further be reduced and thereby the implantation deformation can further be reduced.

Furthermore, as a semiconductor substrate, a monocrystalline silicon substrate formed by the CZ method or a substrate composed of a monocrystalline silicon substrate formed by the CZ method and a monocrystalline silicon formed on the monocrystalline silicon substrate formed by the CZ method by the vapor chemical reaction is used (ninth aspect). As a result, the occurrence of the dislocation due to thermal stress can be controlled and the occurrence of the warp of the semiconductor substrate can be prevented.

Besides the above features, it is recommendable that a thick thermal oxide film (field oxide film) is selectively formed on the surface of the semiconductor substrate by using the thermal oxide film as a pad oxide film without removing the thermal oxide film after the junction forming process. As a result, there is no need to form a special thermal oxide film again and thereby the number of manufacturing processes can be reduced.

It is also acceptable that the above thin film is patterned before the ion implantation for well formation and thermal oxidation treatment is provided for the formation of the thick oxide film by using the pattern provided on the thin film without removing the thermal oxide film and the thin film. Furthermore, it is acceptable that a thick oxide film is formed by performing the photolithography process and etching process on the above thin film once respectively and a position depicting mark necessary for the manufacturing process for a MOS type semiconductor device is formed with the formed thick oxide film, whereby the implantation deformation can further be reduced.

In order to prove the effect of the present invention, the inventors of the present invention formed a deep junction with a specified concentration by four different processes, formed an N-type MOS transistor as an example and measured the surface OSF density thereof. These four different processes are: (1) the conventional process illustrated in FIGS. 20, 21A and 21B (boron ion implantation dose [Dose]=1.2×10$^{14}$ [pieces/cm$^2$]); (2) a process in which the ion implantation dose is reduced by reducing the junction depth by 80% down from the conventional process (shortening the high temperature heat treatment duration to 64% of the conventional process, boron ion implantation dose [Dose]=9.0×10$^{13}$ [pieces/cm$^2$]) (hereinafter referred to as the "improved process A"); (3) a process in which the external diffusion of the implanted ions is prevented by leaving the thermal oxide film on the substrate surface against the improved process A and thereby the ion implantation dose is reduced (hereinafter referred to as the "improved process B," boron ion implantation dose =6.8× 10$^{13}$ [pieces/cm$^2$]); and (4) a process in which the ion implantation dose is reduced by limiting the type of ions to be implanted during the formation of the deep junction to boron alone against the improved process B (hereinafter referred to as the "improved process C," boron ion implantation dose=4.4×10$^{13}$ [pieces/cm$^2$]). The results of this measurement and the results of the crystallinity evaluation by using the life time ($\tau$g) obtained by the C/T method are shown in FIGS. 8 and 9, respectively.

Figure 8:
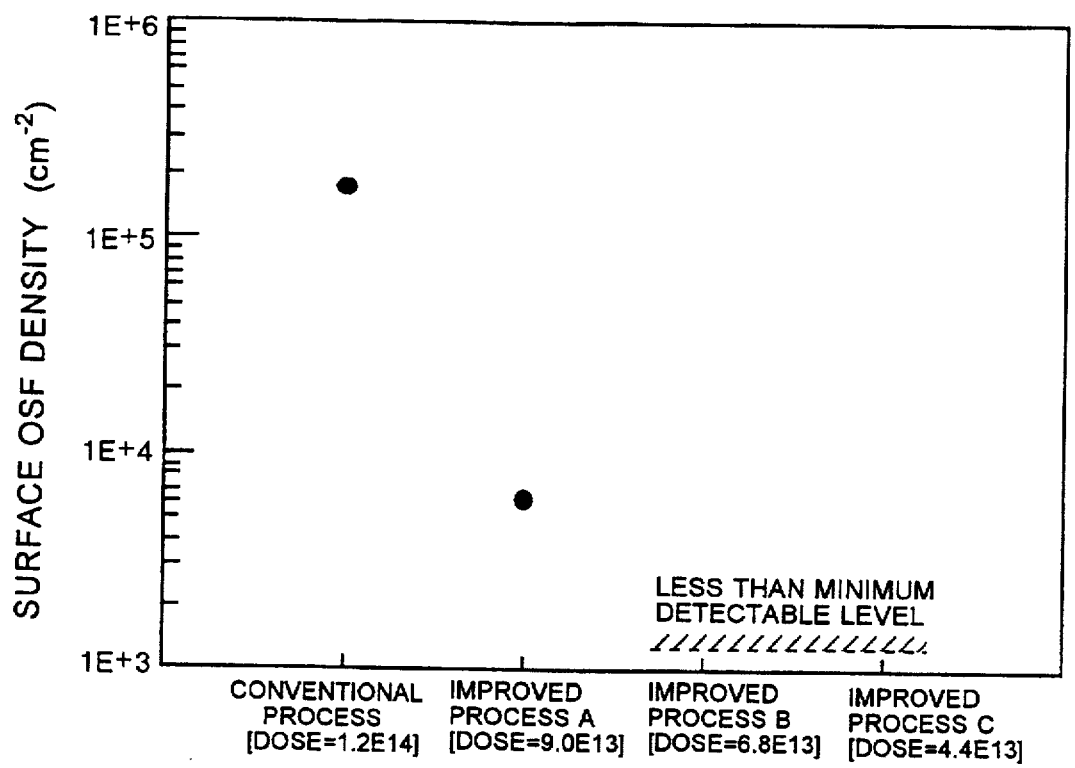
FIG. 8 is a graph showing the effect of the surface OSF density lowering.
Figure 9:
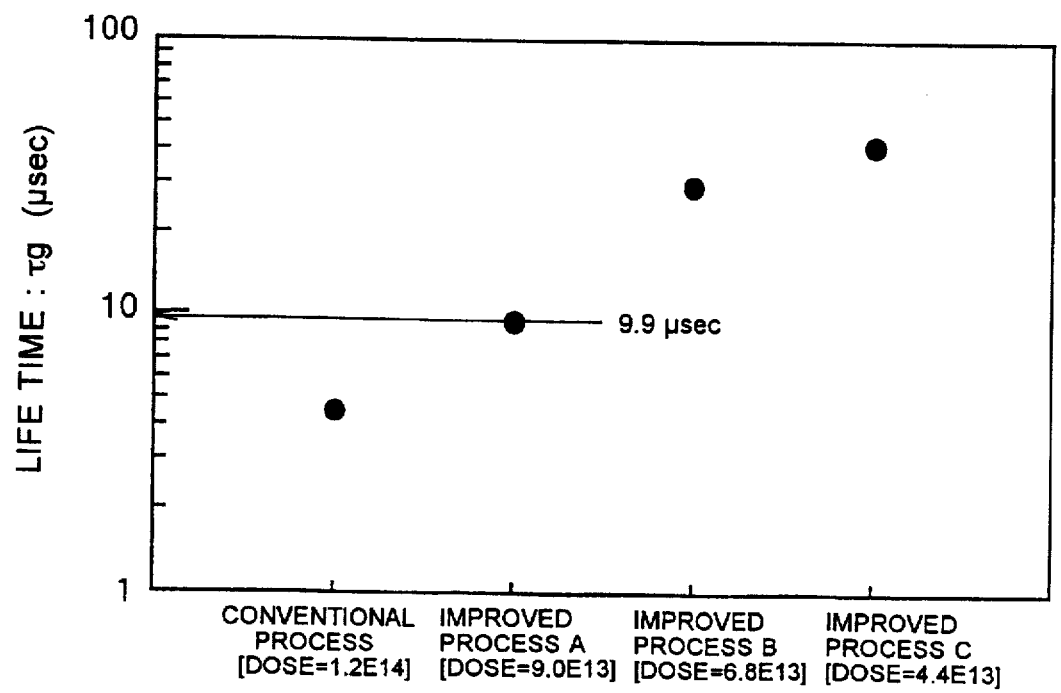
FIG. 9 is a graph showing the effect of the crystallinity improvement.

As evident from FIG. 8, the improved processes A, B and C, all of which corresponds to the present invention, have effects that the surface OSF can be reduced to an undetectable level. Furthermore, as evident from FIG. 9, the present invention can improve the crystallinity of a MOS type semiconductor device up to the last digit as $\tau$g=9.9 μsec by the improved process A, $\tau$g=32.8 μsec by the improved process B and $\tau$g=39.2 μsec by the improved process C from $\tau$g=4.4 μsec by the conventional process.

Figure 10:
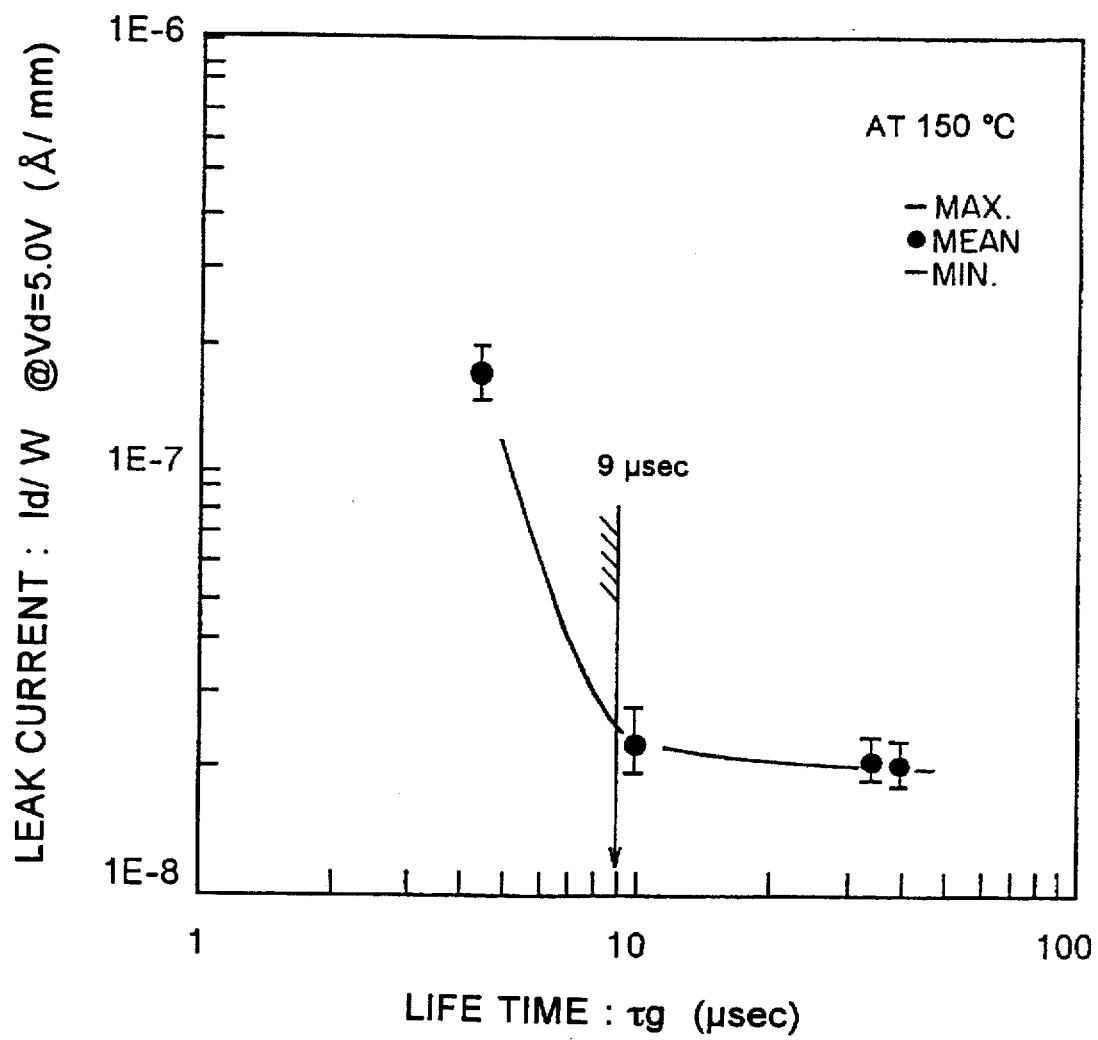
FIG. 10 is a graph showing the effect of the drain leak current improvement.
Figure 11:
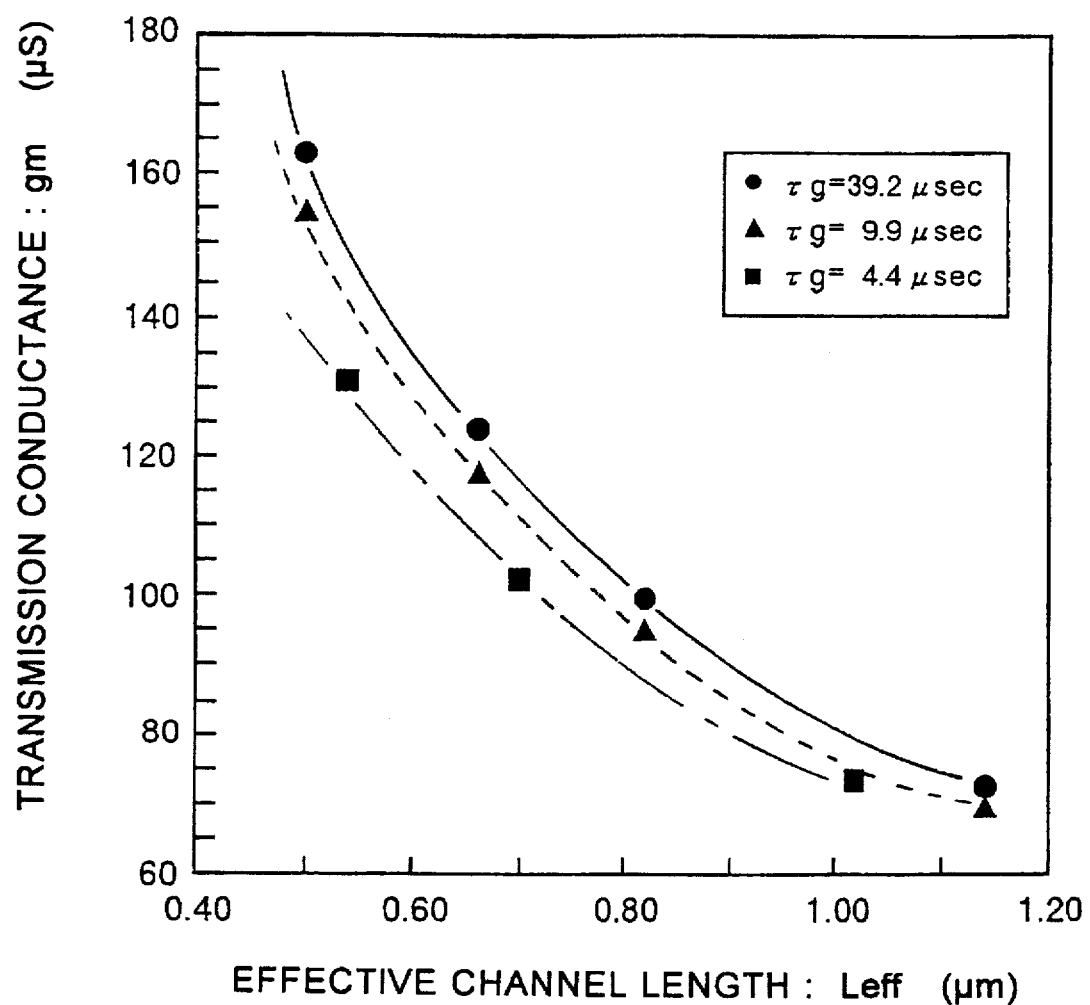
FIG. 11 is a graph showing the effect of the current performance improvement of a MOS type transistor.

Moreover, as an improvement effect of the electric characteristics of a MOS type semiconductor device according to the present invention, the results of the measurement of the drain current when the gate voltage within the subthreshold region at a high temperature (150° C.) is 0 [V] (hereinafter referred to as the "drain leak current") against the N-type MOS transistor formed in the above process are shown in FIG. 10, and the results of the measurement of the propagation conductance (gm) indicating the current performance of the MOS transistor are shown in FIG. 11.

It is evident from FIG. 10 that when the life time is longer than $\tau$g=9 μsec, the drain leak current substantially reduces. This can be considered that, as shown in FIG. 9, in the present invention, which improves the life time to $\tau$g=9.9 μsec or more (by the improved process A) from $\tau$g=4.4 μsec (by the conventional process), since the ion implantation dose is set to 9.0×10$^{13}$ [pieces/cm$^2$] or less, the surface OSF can substantially be reduced as shown in FIGS. 6 and 8, and thereby the drain leak current substantially reduces. To add, as shown in FIG. 11, the propagation conductance can be improved by approximately 10% according to the present invention.

Figure 12:
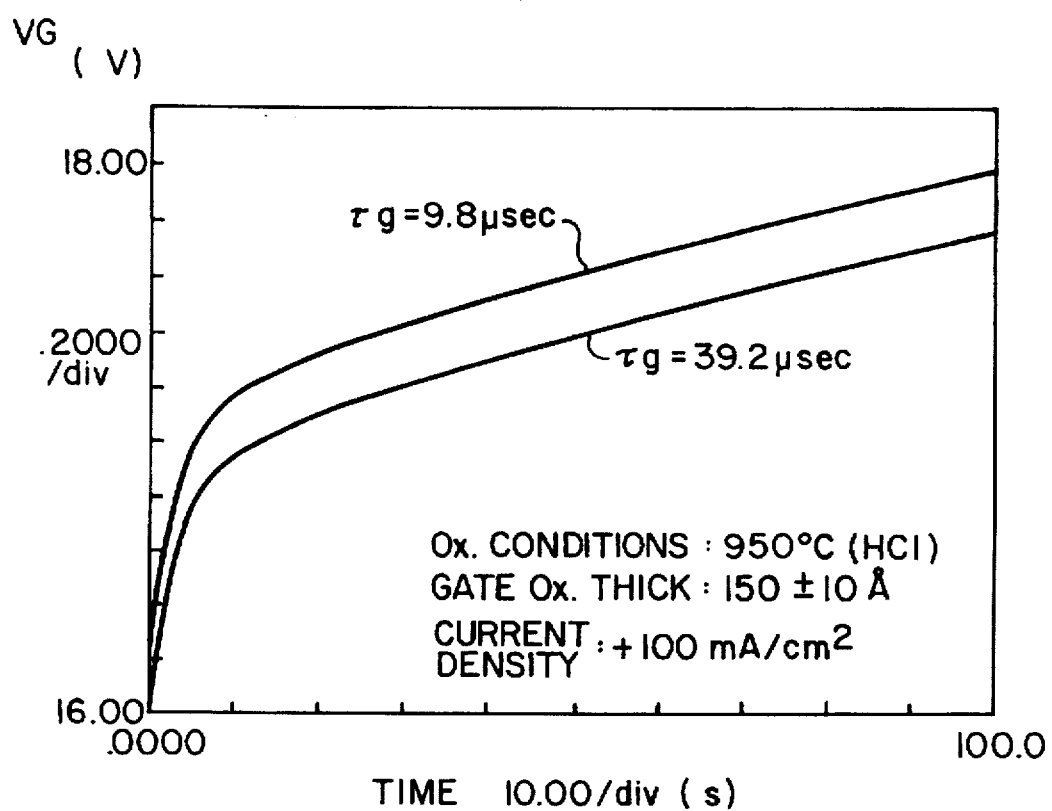
FIGS. 12 and 13 are graphs showing the results of the effect on the constant current TDDB characteristics.

Furthermore, the results of the comparison of the constant current TDDB (time dependent dielectric breakdown) as the evaluation of the characteristics of breakdown on standing of the gate oxide film, which is an important factor of the reliability of a MOS type semiconductor device, are shown in FIG. 12.

Figure 13:
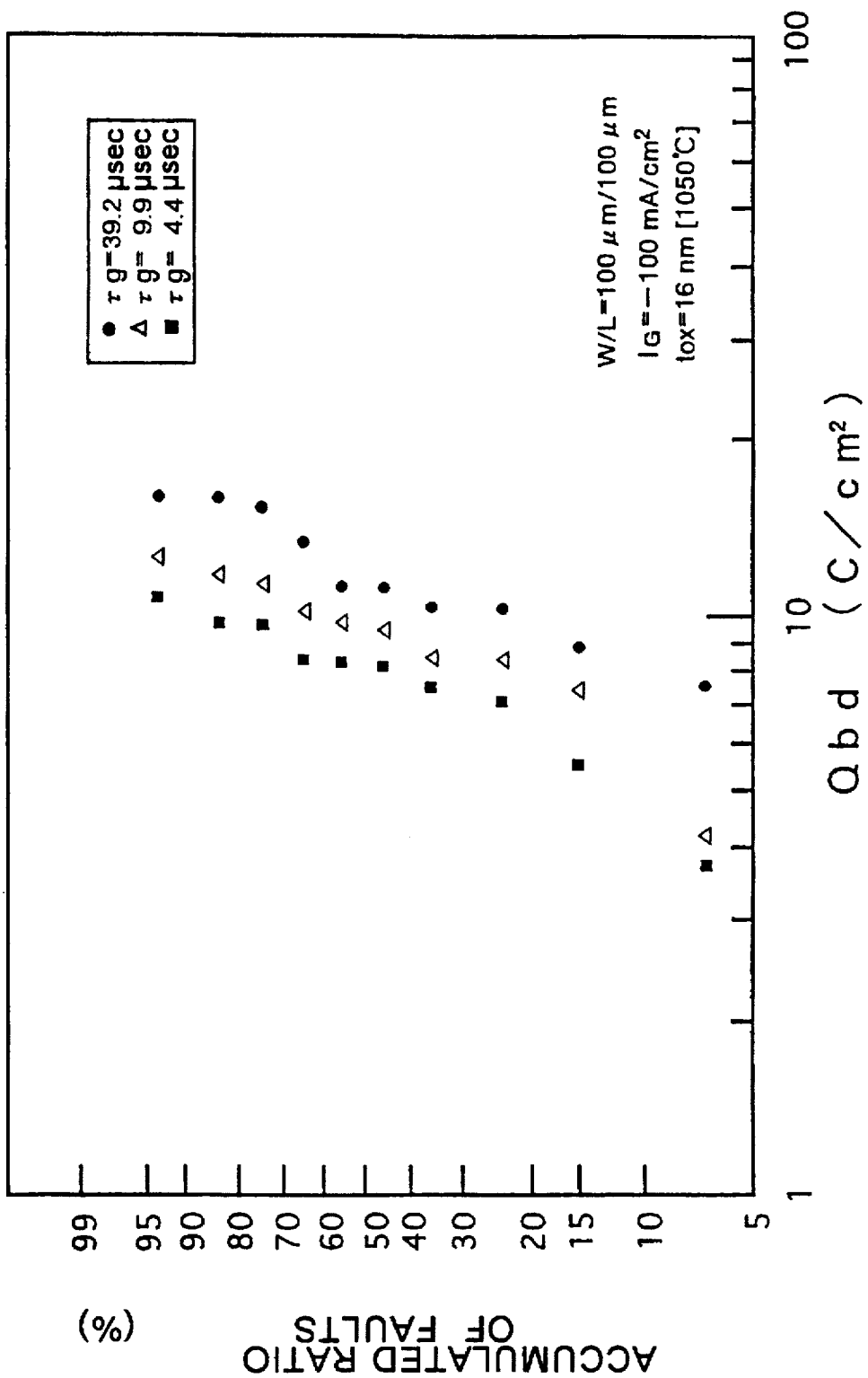

As evident from FIG. 12, the reliability of the oxide film can be improved by lowering the initial capture level within the gate oxide film according to the present invention. Furthermore, as shown in FIG. 13, also in the comparison of the total electric charge quantity (Qbd) [C/cm$^2$] until the breakdown of the gate oxide film occurs, it is evident that the present invention is effective in the improvement of the quality and reliability of the oxide film.

(First Embodiment)

Figure 1:
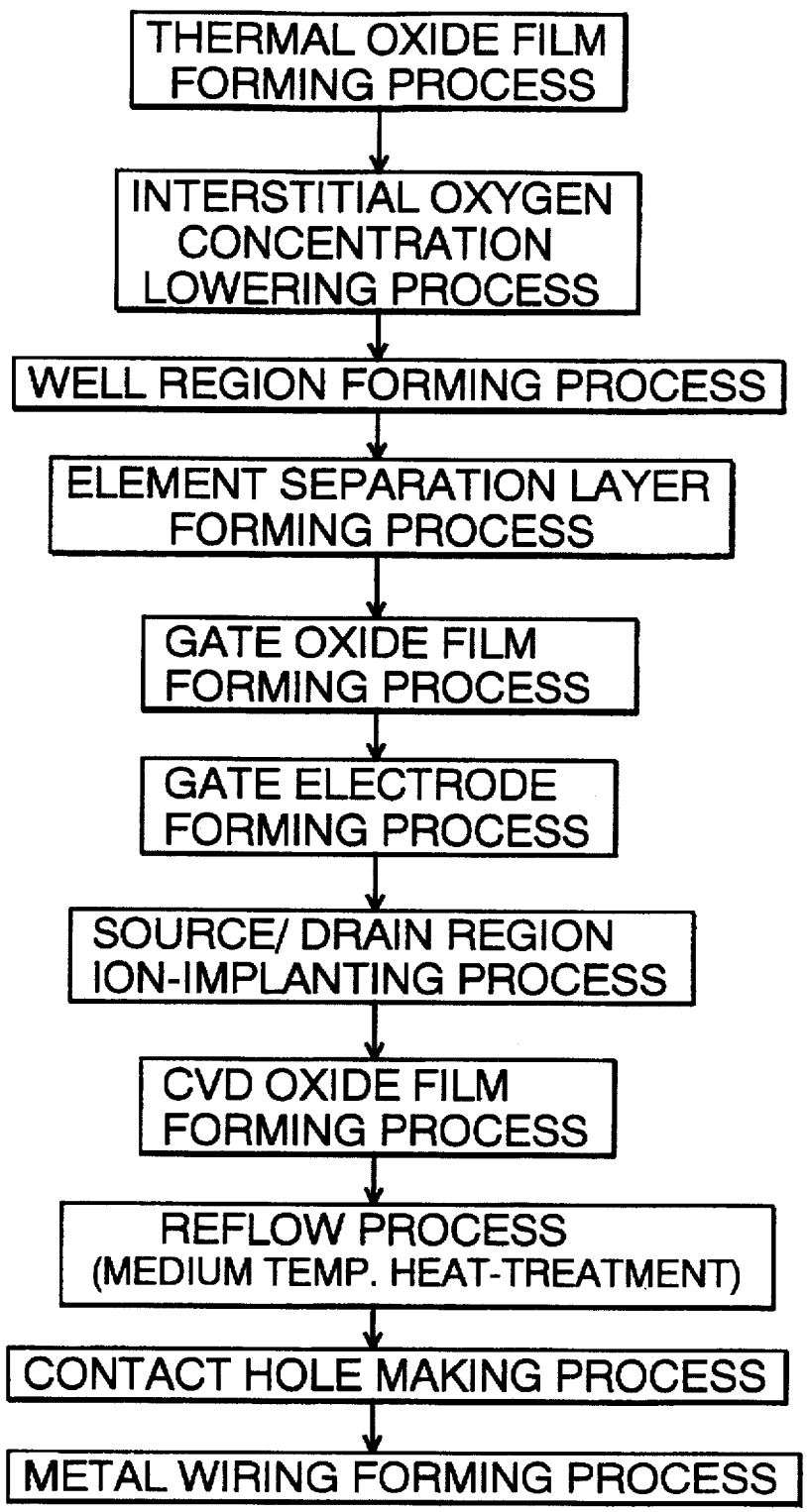
FIG. 1 is a process flow chart illustrating the manufacturing method for a MOS type semiconductor device according to the present invention.
Figure 2A:
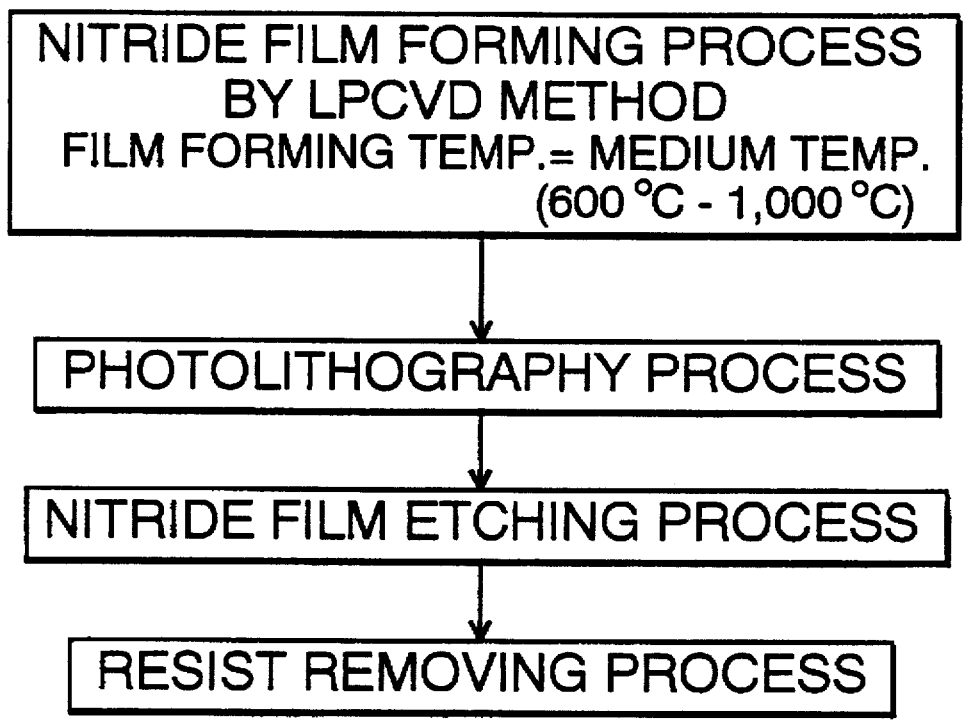
FIGS. 2A, 2B and 2C are process flow charts specifically illustrating an interstitial oxygen concentration lowering process, a well region forming process and an element separation layer forming process, respectively, in the first embodiment of the manufacturing method for a MOS type semiconductor device according to the present invention.
Figure 2B:
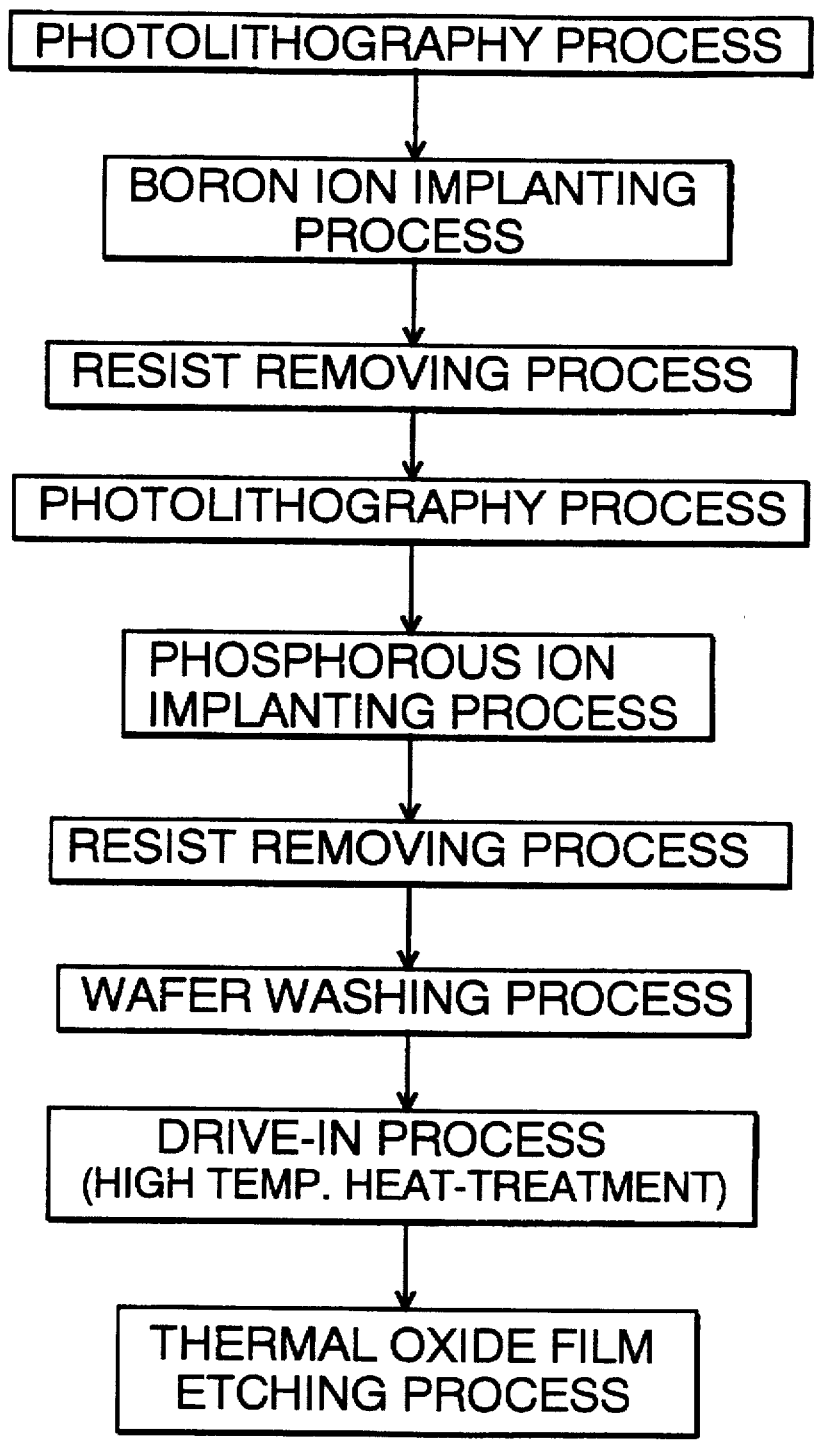
Figure 2C:
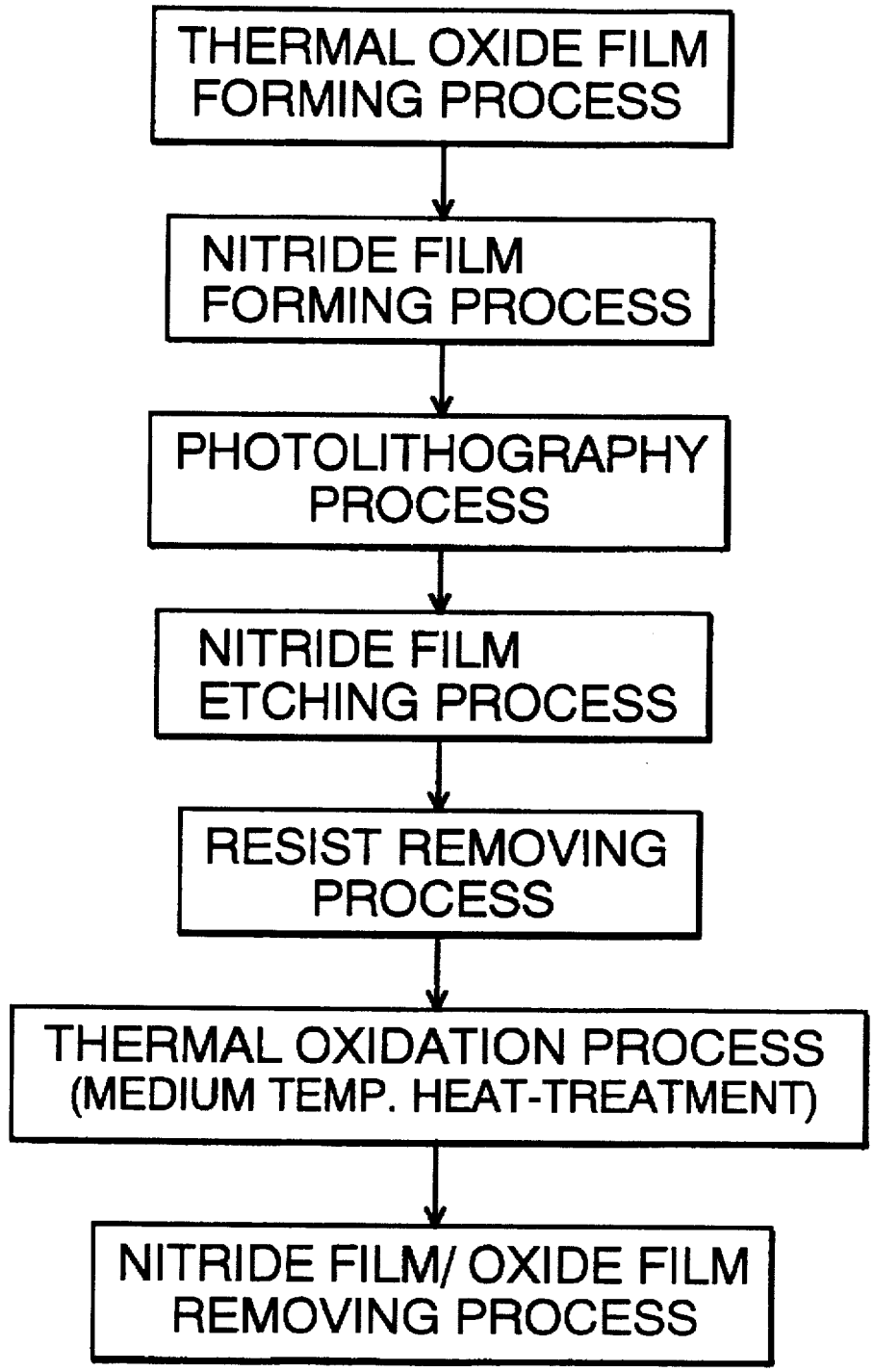

Referring to FIGS. 1 and 2A to 2C, the first embodiment according to the present invention will now be described.

wherein FIG. 1 is an entire process flow chart of the present invention, FIG. 2A is a process flow chart for lowering the concentration of the interstitial oxygen (Oi) according to the first embodiment, FIG. 2B is a process flow chart for forming a well region according to the first embodiment, and FIG. 2C is a process flow chart for forming an element separation layer according to the first embodiment.

Figure 3A:
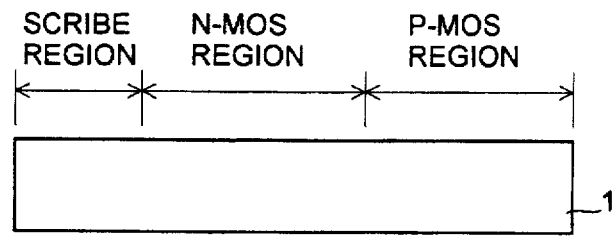
FIGS. 3A through 3G are cross-sectional views of a silicon wafer at the main processes of the first embodiment.
Figure 3B:
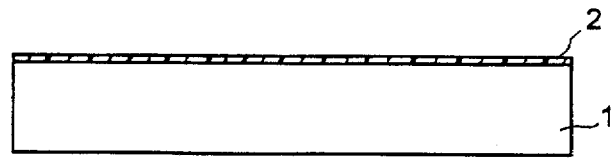

Firstly, as a thermal oxide film forming process in FIG. 1, on a silicon substrate 1 (FIG. 3A) formed by the Czochralski (CZ) method is formed a thermal oxide film 2 as illustrated in FIG. 3B.

Figure 3C:
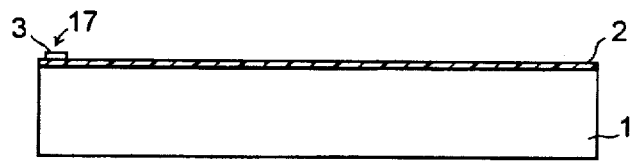

In the interstitial oxygen concentration lowering process illustrated in FIGS. 1 and 2A, the following steps are sequentially performed. A thin film having the selectivity of etching to the thermal oxide film 2 and requiring medium temperature heat treatment within a temperature range from 600° C. to 1,000° C. required during the film forming process thereof, e.g., a nitride film 3 by the low pressured CVD method, is formed. Then, a first alignment mark 17 for positional detection required in the subsequent photolithography process is formed with the nitride film 3. In this time, the nitride film 3 is patterned so that the thermal oxide film 2 can be left on the semiconductor device formation region on the surface of the silicon substrate 1. FIG. 3C illustrates the state in which the resist has been removed therefrom.

Next, as a well region forming process of FIGS. 1 and 2B, impurity ions (boron ions and phosphorous ions) are implanted into specified regions, respectively, by repeating the photolithography process, the ion implanting process and the resist removing process, all of which are performed using the first alignment mark 17 for position alignment. In this process, the ion implantation dose in each of the ion implanting processes is set to $9 \times 10^{13}$ [pieces/cm$^2$] or less, and only one type impurity ions for obtaining the specified conductivity type are implanted into the respective specified regions. In other words, one specified region for forming P-well region described later is implanted with only Boron ions, and the other specified region for forming N-well region described later is implanted with only Phosphorous ions.

Figure 3D:
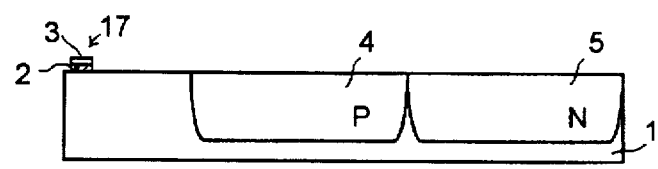

Then, while the thermal oxide film 2 remains left, high temperature heat treatment is provided as a drive-in process at a heat treatment temperature of over 1,000° C. (1,100° C. or more, if possible), and then a thermal oxide film etching process for removing the thermal oxide film 2 is provided to form a P-well region 4 and an N-well region 5, both of which have deep junctions (see FIG. 3D).

Figure 3E:
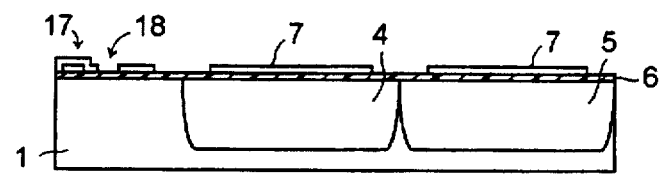
Figure 3F:
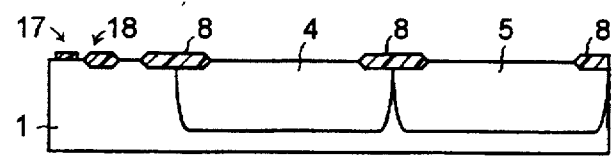

Following the above, as illustrated in FIGS. 1 and 2C, an element separation layer forming process is performed as described in this passage. Firstly, a thermal oxide film 6 and a nitride film 7 are newly formed, the photolithography process and the nitride film etching process are performed using the first alignment mark 17, and the resist is removed (see FIG. 3E). At this time, the nitride film 7 is patterned so as to be a mask to be used for selectively forming an alignment mark, which will be required in the subsequent photolithography process, and a thick oxide film. In this state, a thermal oxidation process is performed, and then, the nitride film 7 and the thermal oxide film 6 located below the nitride film 7 are removed, whereby a thick oxide film (field oxide film) 8 for separating element regions and a second alignment mark 18 formed of thick oxide film are formed (see FIG. 3F).

Figure 3G:
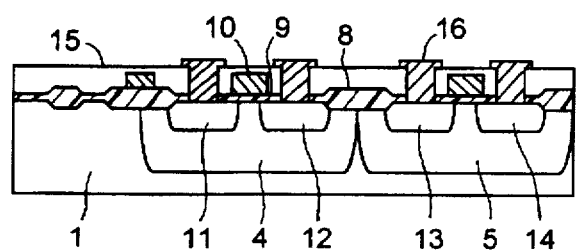

Subsequently, as illustrated in FIG. 1, a gate oxide film 9 and a gate electrode 10 are formed, the specified ions are implanted into a specified region to be of a specified conductivity type in order to form a source/drain region of the MOS type semiconductor device, a CVD oxide film 15 is formed, and then a reflow process is performed, thereby forming an N$^+$ source region 11, an N$^+$ drain region 12, a P$^+$ drain region 13 and a P$^+$ source region 14. Then, a contact hole is made and a metal electrode 16 is formed to complete the manufacture of a MOS type semiconductor device illustrated in FIG. 3G.

As described above, according to the first embodiment, the interstitial oxygen concentration lowering process is performed in the first place. That is, the medium temperature heat treatment related to the formation of the nitride film 3 is performed before the formation of well region. This medium temperature heat treatment can control the rise in the interstitial oxygen (Oi) concentration, reduce the implantation deformation caused during the ion implantation, control the occurrence of the process inductive fault, improve the crystallinity of the semiconductor substrate, and thereby improve the electric characteristics of the MOS type semiconductor device.

As the ion implantation dose in the well region forming process is set to $9 \times 10^{13}$ [pieces/cm$^2$] or less to form the corresponding well region, the implantation deformation caused during the ion implantation is reduced, the occurrence of the process inductive fault is reduced, and thereby the electric characteristics of the MOS type semiconductor device can be improved. Besides, by providing the high temperature heat treatment with the thermal oxide film 2 remains formed and limiting the type of ions to be implanted into the well regions 4 and 5 to one type respectively, the occurrence of the process inductive fault can further be reduced and thereby the electric characteristics of the MOS type semiconductor device can be improved.

(Second Embodiment)

Figure 14:
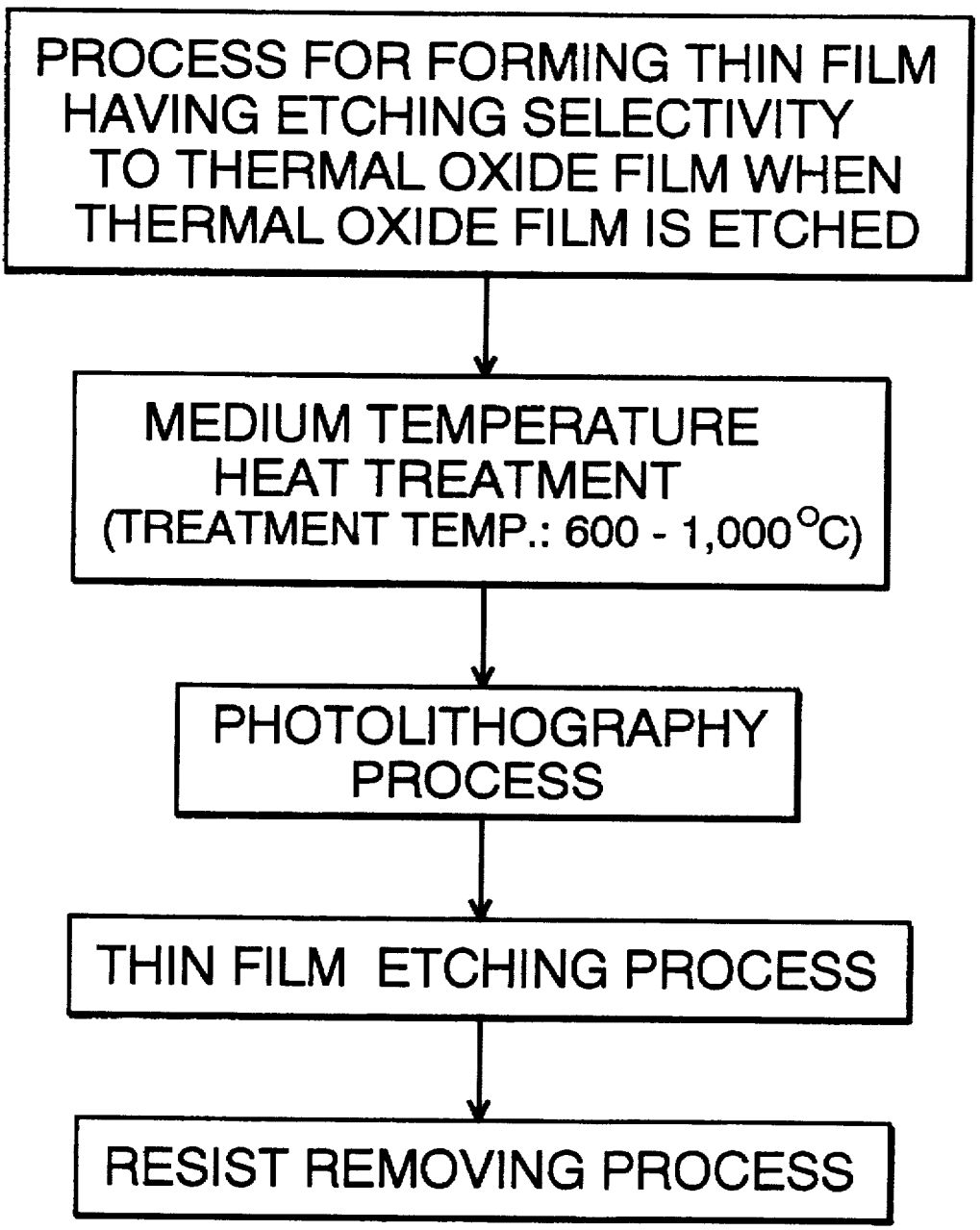
FIG. 14 is a process flow chart illustrating the interstitial oxygen concentration lowering process in the second embodiment of the manufacturing method for a MOS type semiconductor device according to the present invention.

Next, the second embodiment according to the present invention will be described referring to FIGS. 1 and 14, wherein FIG. 14 illustrates a process flow chart of the second embodiment for the interstitial oxygen concentration lowering process illustrated in FIG. 1.

Figure 15A:
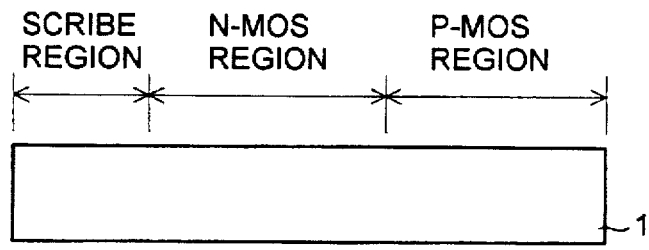
FIGS. 15A through 15E are cross-sectional views of a silicon wafer at the main processes of the second embodiment.
Figure 15B:
Figure 15C:
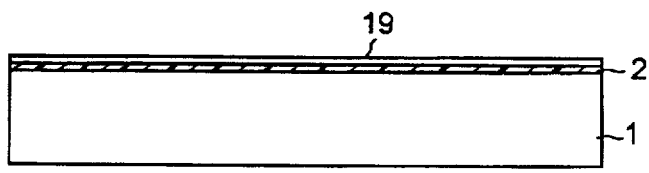

In the same way as the process illustrated in FIGS. 1 and 3A, on the silicon substrate 1 (FIG. 15A) formed by the CZ method is formed the thermal oxide film 2 (FIG. 15B), and the treatment illustrated in FIG. 14 is provided as an interstitial oxygen concentration lowering process. That is, a thin film 19 having the selectivity of etching to the thermal oxide film 2 is formed, and the medium temperature heat treatment is provided within a temperature range from 600° C. to 1,000° C. (FIG. 15C).

Figure 15D:
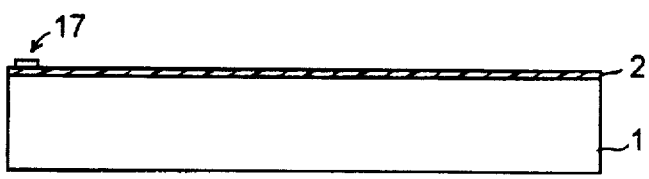

Then, in order to form the first alignment mark 17 for positional detection required in the subsequent photolithography process, the above thin film 19 is processed while the thermal oxide film 2 remains left on at least the semiconductor device forming region of the surface of the silicon substrate 1 (see FIG. 15D).

Figure 15E:
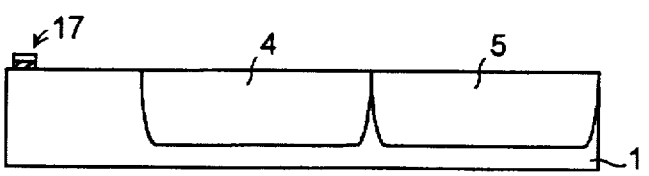

Next, in the same way as the first embodiment illustrated in FIG. 2B, impurity ions are implanted into specified regions by repeating the photolithography process, the ion implanting process and the resist removing process by using the first alignment mark 17. In this case, each of the ion implantation dose in the ion implanting process is set to $9 \times 10^{13}$ [pieces/cm$^2$] or less, and only the impurity ions which can obtain a specified conductivity type are implanted into each of the specified regions. Then, by providing the high temperature heat treatment at a temperature of over 1,000° C. (1,100° C. or more, if possible) and removing the thermal oxide film 2, the P-well region 4 and the N-well region 5 (see FIG. 15E) are formed corresponding to the respective implanted specified regions.

Following the above, processes of the element separation layer forming process and the subsequent process, which are shown in FIGS. 1 and 2C, are performed to complete the manufacture of the MOS type semiconductor device.

Also in this second embodiment, the same effect as that of the manufacturing method according to the first embodiment can be obtained by providing the thin film formation and the medium temperature heat treatment separately before the well region forming process.

(Third Embodiment)

Figure 16A:
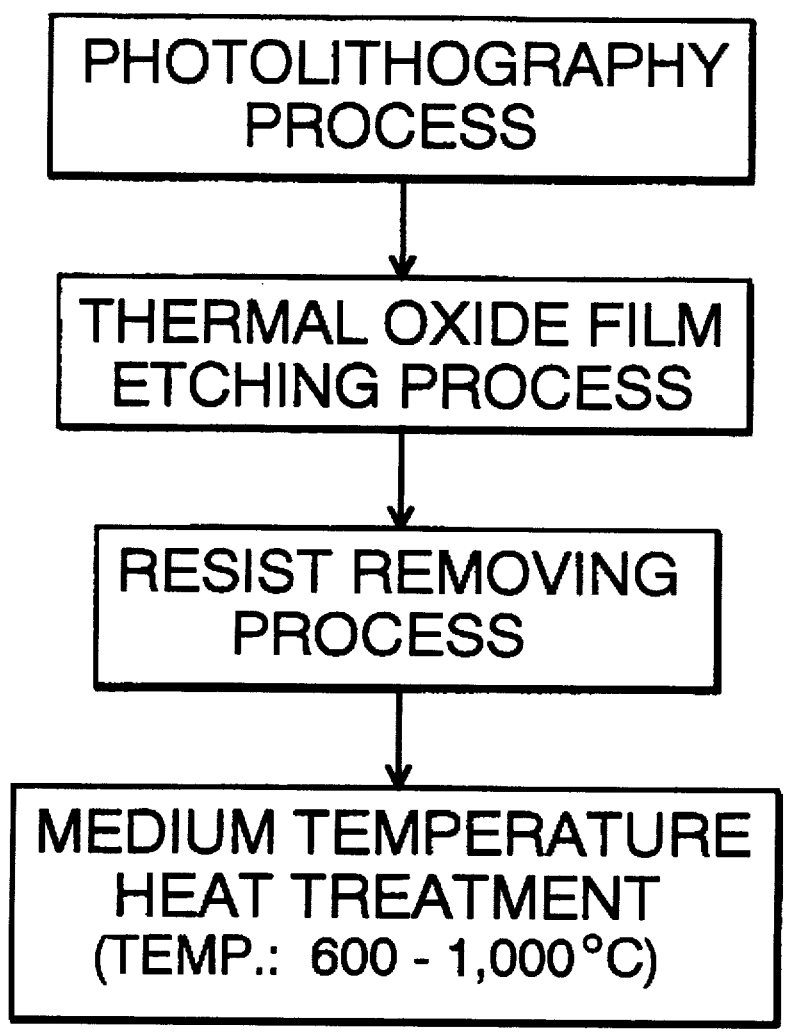
FIGS. 16A, 16B and 16C are process flow charts specifically illustrating an interstitial oxygen concentration lowering process, a well region forming process and an element separation layer forming process, respectively, in the third embodiment of the manufacturing method for a MOS type semiconductor device according to the present invention.
Figure 16B:
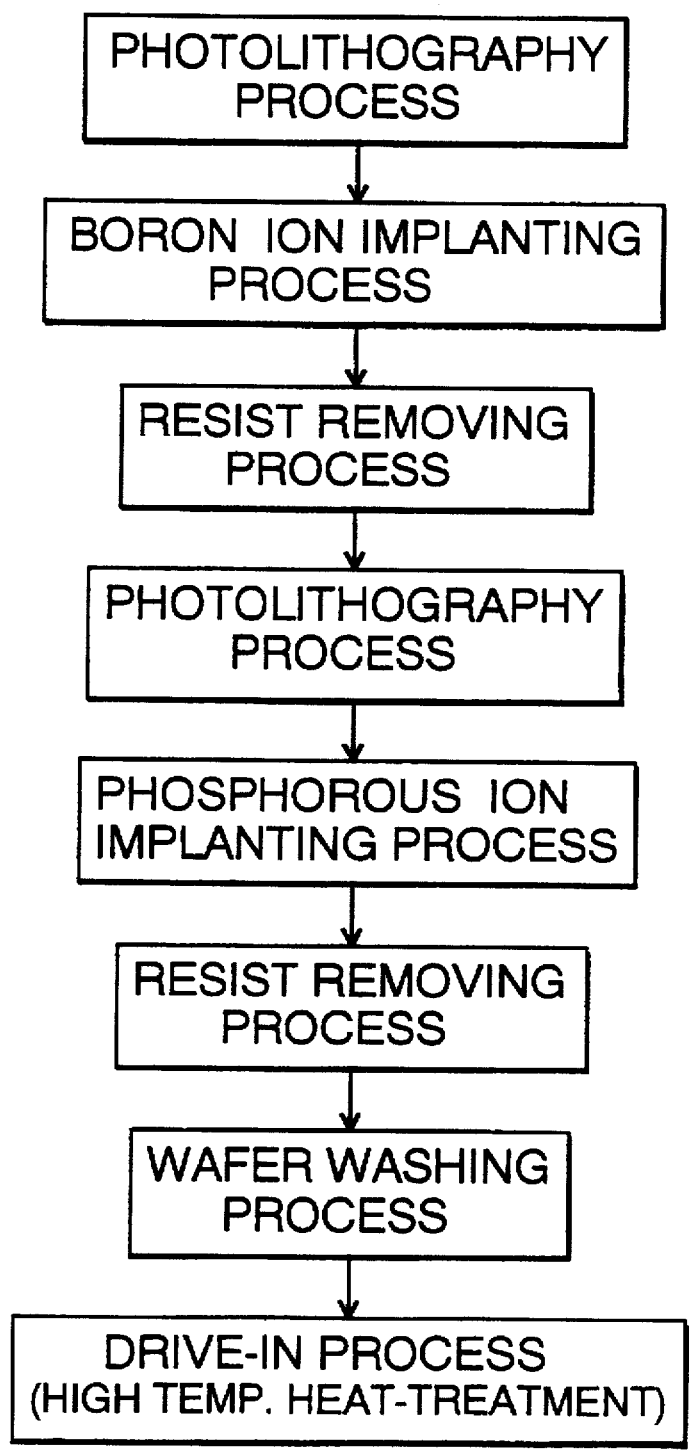
Figure 16C:
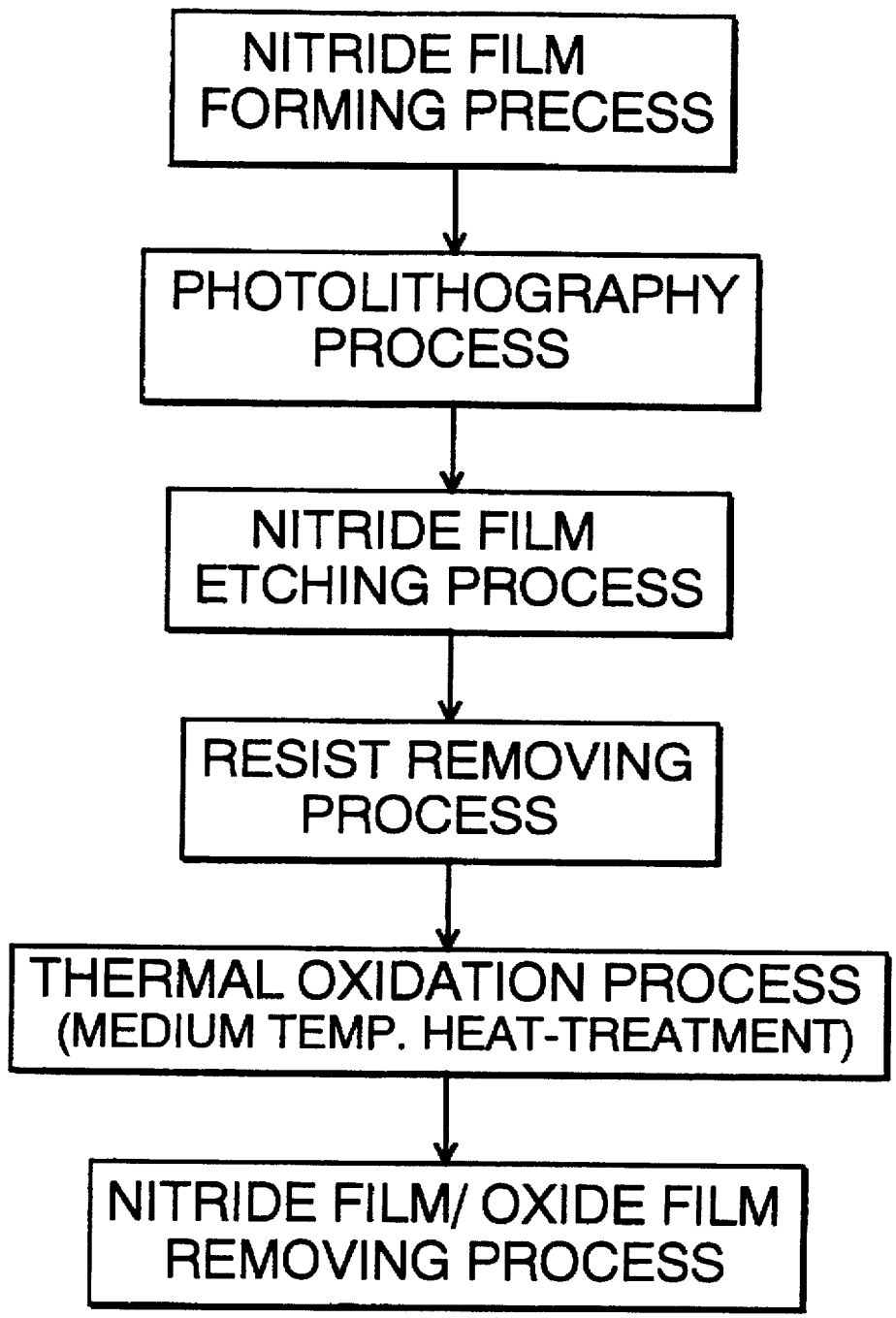

The third embodiment according to the present invention will now be described referring to FIGS. 1, 16A to 16C, wherein FIG. 1 is an entire process flow chart of the manufacturing method for a MOS semiconductor device according to the present invention, FIGS. 16A to 16C are process flow charts for the interstitial oxygen concentration lowering process, the well region forming process and the element separation layer forming process according to the third embodiment, respectively.

Figure 17A:
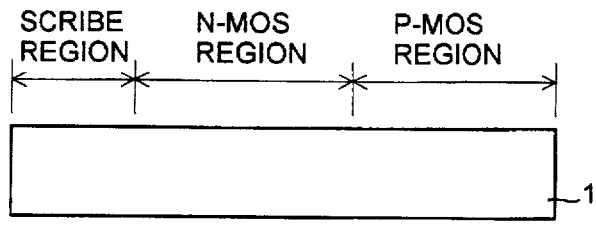
FIGS. 17A through 17H are cross-sectional views of a silicon wafer at the main processes of the third embodiment.
Figure 17B:
Figure 17C:
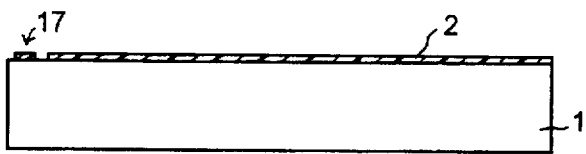

Firstly, on a silicon substrate 1 (FIG. 17A) formed by the CZ method is formed a thermal oxide film 2 (FIG. 17B), and the treatment illustrated in FIG. 16A is provided as the interstitial oxygen concentration lowering process. That is, the thermal oxide film 2 is patterned by the photolithography process and the etching process so that the thermal oxide film 2 can be left at least on the semiconductor device forming region of the surface of the silicon substrate 1. At this time, by patterning the thermal oxide film 2, the first alignment mark 17 for positional detection required in the subsequent photolithography process is formed with the thermal oxide film. Then, the resist used in the photolithography process is removed and the medium temperature heat treatment is provided within a temperature range from 600° C. to 1,000° C. (see FIG. 17C).

Figure 17D:
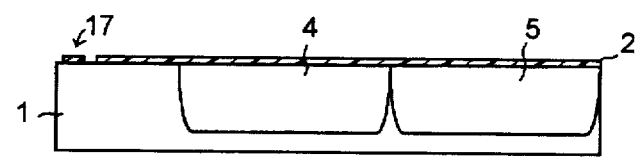

Then, as a well region forming process, the treatment illustrated in FIG. 16B is provided. That is, impurity ions for forming well regions are implanted into respective specified regions by repeating the photolithography process, the ion implanting process and the resist removing process, all of which use the first alignment mark 17 for position aligning. In this process, the ion implantation dose in each ion implanting process is set to $9 \times 10^{13}$ [pieces/cm$^2$] or less, and only one type impurity ions which can obtain a specified conductivity type are implanted into the corresponding specified region. Then, the high temperature heat treatment (drive-in process) is provided at a temperature of 1,100° C. or more, if possible, to form the P-well region 4 and the N-well region 5 (see FIG. 17D)

Figure 17E:
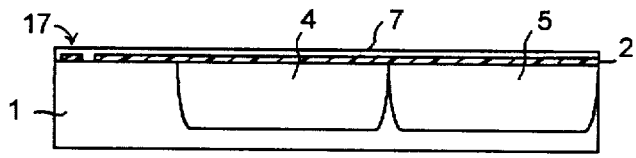
Figure 17F:
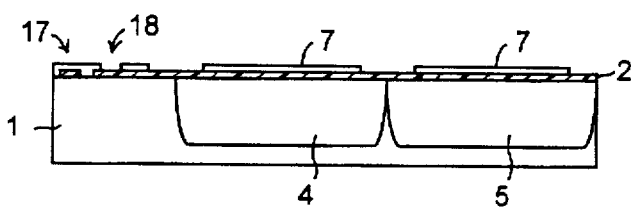
Figure 17G:
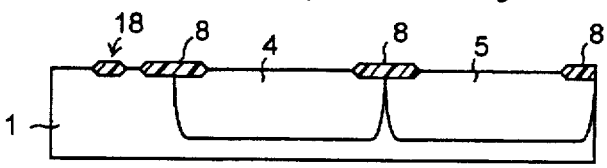

Subsequently, as illustrated in FIG. 16C, the element separation layer forming process is performed without removing the thermal oxide film 2. Specifically, the nitride film 7 is formed (FIG. 17E), the photolithography process and the etching process are performed using the above first alignment mark 17, whereby the nitride film 7 is patterned so as to be a mask for locally forming a thick oxide film which used as an alignment mark required in the subsequent photolithography process and as a field oxide film. Then, after the thermal oxidation process is performed, the thermal oxide film 2 and the nitride film 7 are removed. As a result, the field oxide film 8 for separating the element regions as well as a second alignment mark 18 of the thick oxide film are formed (see FIG. 17G).

Following the above, as illustrated in FIG. 1, a gate oxide film 9 and a gate electrode 10 are formed, the specified ions are implanted into a specified region to be of a specified conductivity type in order to form a source/drain region of the MOS type semiconductor device, a CVD oxide film 15 is formed, and then a reflow process is performed, thereby forming the N$^+$ source region 11, the N$^+$ drain region 12, the P$^+$ drain region 13 and the P$^+$ source region 14.

Figure 17H:
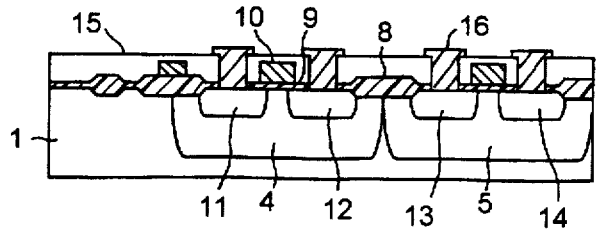

Then, a contact hole is made and a metal electrode 16 is formed to complete the manufacture of the MOS type semiconductor device illustrated in FIG. 17H.

According to the third embodiment, in comparison with the conventional process illustrated in FIGS. 20, 21A to 21C, and furthermore with the first embodiment, the special thermal oxide film 6 (FIG. 3E) is not formed during the element separation layer formation. As a result, the rise in the interstitial oxygen (Oi) concentration during the formation of the thermal oxide film 6 can be controlled, the occurrence of the process inductive fault can be controlled, the crystallinity of the semiconductor substrate can be improved, and thereby the electric characteristics of the MOS type semiconductor device can be improved.

(Fourth Embodiment)

Figure 18A:
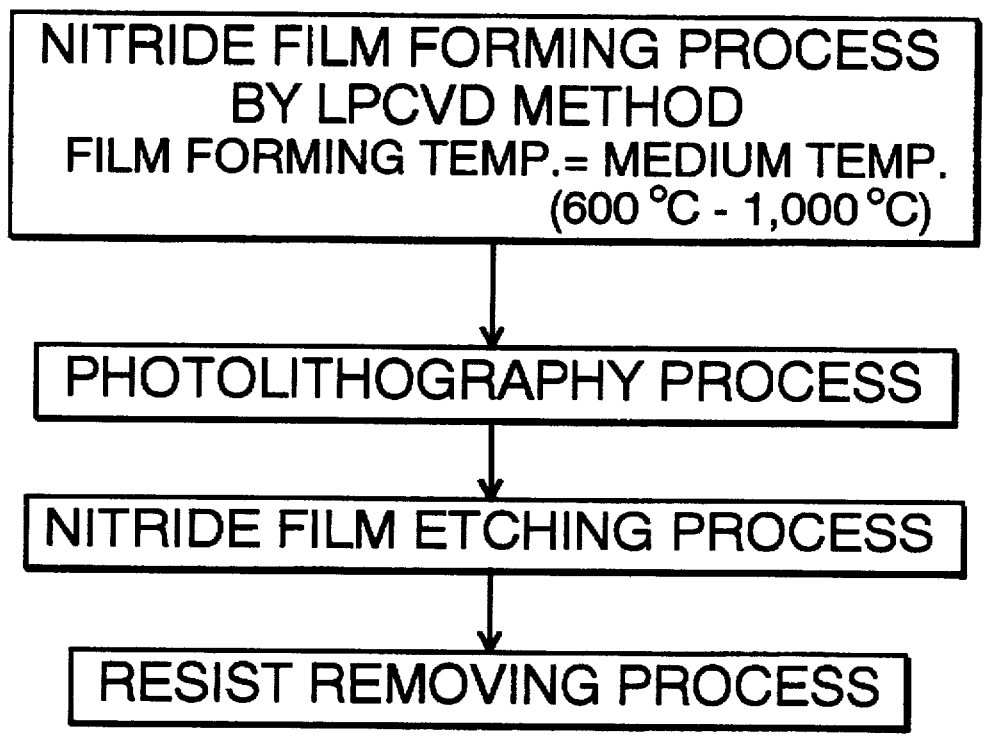
FIGS. 18A, 18B and 18C are process flow charts specifically illustrating an interstitial oxygen concentration lowering process, a well region forming process and an element separation layer forming process, respectively, in the fourth embodiment of the manufacturing method for a MOS type semiconductor device according to the present invention.
Figure 18B:
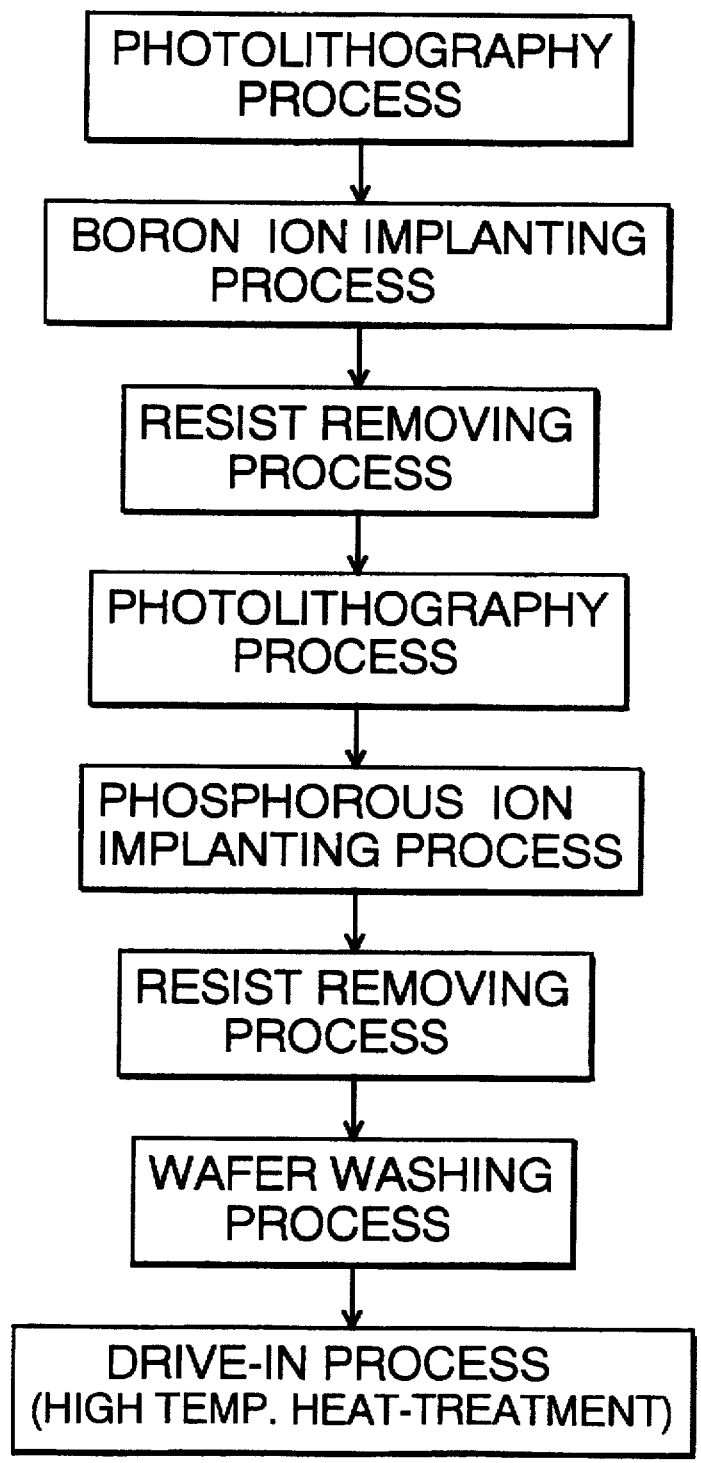
Figure 18C:
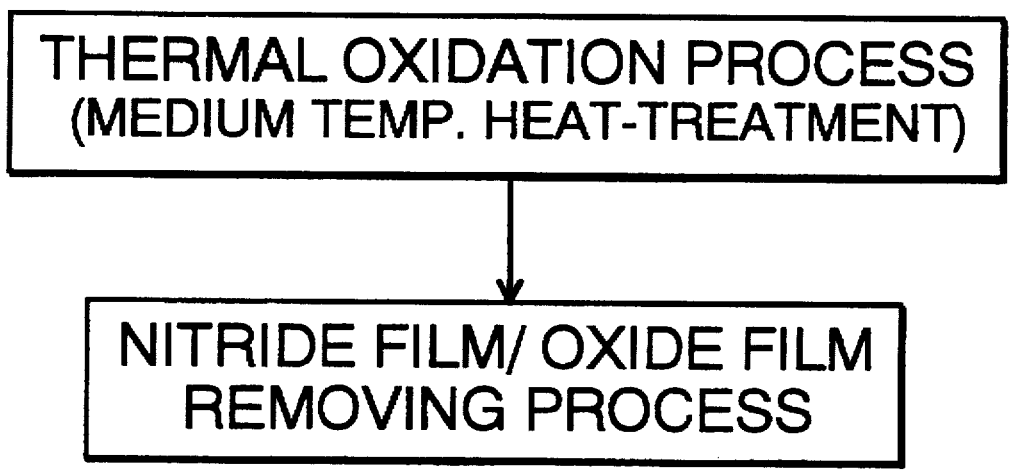

Furthermore, the fourth embodiment according to the present invention will be described referring to FIGS. 1, 8A to 8C, wherein FIG. 1 is an entire process flow chart of the manufacturing method for a MOS semiconductor device according to the present invention, FIGS. 18A to 18C are process flow charts for the interstitial oxygen concentration lowering process, the well region forming process and the element separation layer forming process of this embodiment, respectively.

Figure 19A:
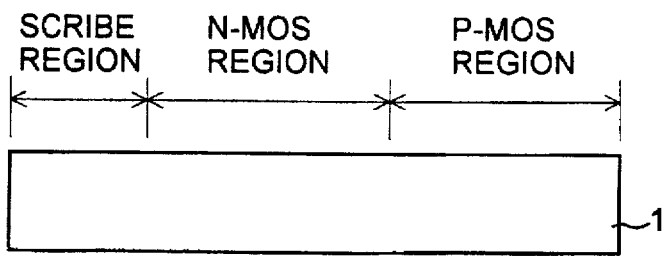
FIGS. 19A through 19F are cross-sectional views of a silicon wafer at the main processes of the fourth embodiment.
Figure 19B:
Figure 19C:
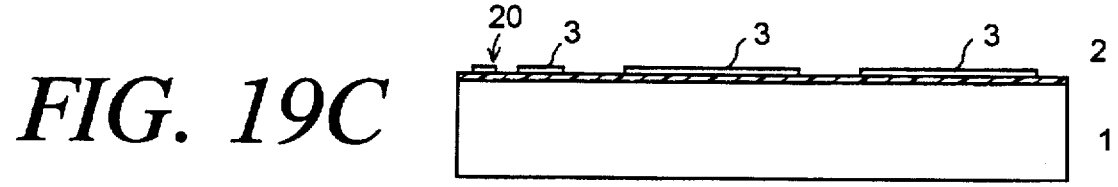

Firstly, on a silicon substrate 1 (FIG. 19A) formed by the CZ method is formed a thermal oxide film 2 (FIG. 19B), and the treatment illustrated in FIG. 18A is provided as an interstitial oxygen concentration lowering process. That is, a thin film having the selectivity of etching to the thermal oxide film 2 and requiring a film forming temperature ranging from 600° C. to 1,000° C., e.g., a nitride film 3 by the low pressured CVD method, is formed. Then, the nitride film 3 is patterned (see FIG. 19C) so as to be a mask for locally forming a thick oxide film on the above silicon substrate 1 by the subsequent thermal oxidation process, and at the same time an alignment mark 20 having the same function as the first alignment mark 17 illustrated in FIG. 3C is formed with the nitride film 3. Incidentally, this alignment mark 20 also has the function of the second alignment mark 18 illustrated in FIGS. 3E and 3F as described herein later.

Figure 19D:
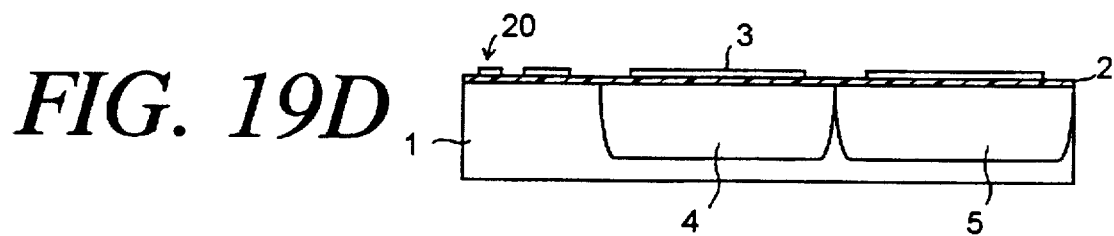

Then, as a well region forming process, the processes illustrated in FIG. 18 are performed. For example, the P-well region 4 and the N-well region 5 are formed by performing the photolithography process, the ion implanting process, the resist removing process and the high temperature heat treatment by using the alignment mark 20 (see FIG. 19D).

Figure 19E:
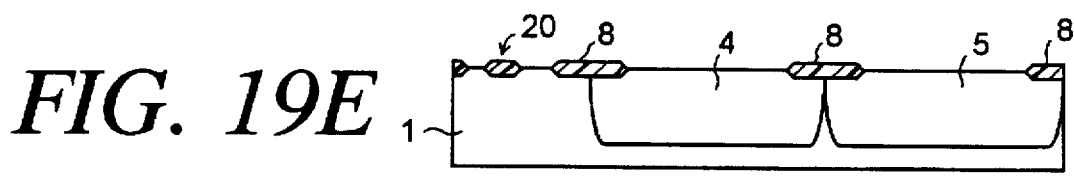

Next, the element separation layer forming process illustrated in FIG. 18C is performed without removing the thermal oxide film 2 and the nitride film 3, that is, the medium temperature thermal oxidation process is performed within a temperature range from 600° C. to 1,000° C. Then, by removing the thermal oxide film 2 and the nitride film 3 from the surface of the silicon substrate 1, the thick oxide film (field oxide film) 8 is formed for separating the element regions. At this time, as illustrated in FIG. 19E, the second alignment mark 20 is formed with the thick oxide film corresponding to a pattern of the nitride film 3, i.e., the alignment mark 20 of nitride film 3.

Figure 19F:
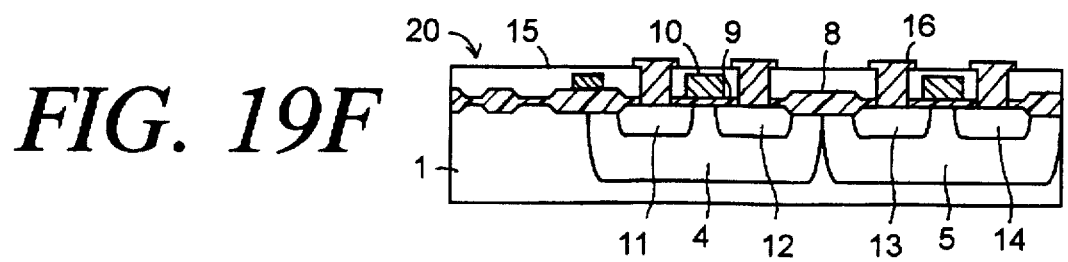

After the above, as illustrated in FIG. 1, a gate oxide film 9 and a gate electrode 10 are formed, the specified ions are implanted into a specified region to be of a specified conductivity type in order to form a source/drain region of the MOS type semiconductor device, a CVD oxide film 15 is formed, and then a reflow process is performed, thereby forming the N⁺ source region 11, the N⁺ drain region 12, the P⁺ drain region 13 and the P⁺ source region 14. Then, a contact hole is made and a metal electrode 16 is formed to complete the manufacture of the MOS type semiconductor device illustrated in FIG. 19F.

According to the fourth embodiment, in the same way as the above third embodiment, the thermal oxide film 2 is not removed after the well region formation, and therefore the special thermal oxide film 6 (see FIGS. 2C and 3E) is not formed during the element separation layer forming process. As a result, the rise in the interstitial oxygen (Oi) concentration during the formation of the thermal oxide film 6 can be controlled, the crystallinity of the semiconductor substrate can be improved, and thereby the electric characteristics of the MOS type semiconductor device can be improved. Furthermore, in comparison with the third embodiment, the forming process for the nitride film 7 (FIG. 17E), the subsequent photolithography process and etching process (FIG. 17F), all being performed during the element separation layer forming process (FIG. 16C), can be omitted. As a result, the cost of the MOS type semiconductor device manufacture can be reduced.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor device comprising the steps of:

forming a thermal oxide film on a surface of a semiconductor substrate wherein an interstitial concentration of oxygen in said semiconductor substrate is increased;

lowering said interstitial oxygen concentration in said semiconductor substrate which includes heat treating said semiconductor substrate within a temperature range from 600° C. to 1,000° C.;

implanting ions into a specified region of said semiconductor substrate;

forming a deep junction within said semiconductor substrate by performing a high temperature heat treatment at a temperature of over 1,000° C.; and forming a transistor in said deep junction.

2. A method for manufacturing a semiconductor device according to claim 1, wherein said interstitial oxygen concentration lowering step includes a step of forming a thin film having an etching selectivity with respect to said thermal oxide film, said thin film forming step being provided before said medium temperature heat treatment.

3. A method for manufacturing a semiconductor device according to claim 2, further comprising a step of forming a position detecting mark on said semiconductor substrate with said thin film, and wherein said transistor forming step includes a step of forming said transistor within said specified region according to said position detecting mark.

4. A method for manufacturing a semiconductor device according to claim 1, further comprising a step of removing said thermal oxide film after said junction forming step.

5. A method for manufacturing a semiconductor device according to claim 2, further comprising a step of removing said thermal oxide film after said junction forming step.

6. A method for manufacturing a semiconductor device according to claim 3, further comprising a step of removing said thermal oxide film after said junction forming step.

7. A method for manufacturing a semiconductor device comprising the steps of:

forming a thermal oxide film on a surface of a semiconductor substrate;

forming a first thin film, said first thin forming step including a medium temperature heat treatment within a temperature range from 600° C. to 1,000° C.;

implanting ions into a specified region of said semiconductor substrate;

forming a deep junction within said semiconductor substrate by performing a high temperature heat treatment at a temperature of over 1,000° C.;

forming a thick thermal filed oxide film, which includes steps of:

forming a second thin film without removing said thermal oxide film, and selectively forming a thick thermal field oxide film on said surface of said semiconductor substrate by thermal oxidation using said second thin film as a mask member, thereby said thick thermal field oxide film separates element regions; and forming a transistor in said deep junction.

8. A method for manufacturing a semiconductor device comprising the steps of:

forming a thermal oxide film on a surface of a semiconductor substrate;

forming a thin film on said thermal oxide film, wherein a temperature ranging from 600° C. to 1,000° C. is imposed on said semiconductor substrate;

patterning said thin film into a specified pattern;

implanting ions into a specified region of said semiconductor substrate;

forming a deep junction within said semiconductor substrate by performing a high temperature heat treatment at a temperature of over 1,000° C.;

selectively forming a thick thermal field oxide film on said surface of said semiconductor substrate by thermal oxidation which is performed without removing said thermal oxide film and said patterned thin film so as to use said patterned thin film as a mask member, thereby said thick thermal field oxide film separates element regions; and forming a transistor by using said deep junction.

9. A method for manufacturing a semiconductor device according to claim 7, wherein said first thin film forming step includes a step of forming said first thin film within a film forming temperature range from 600° C. to 1,000° C.

10. A method for manufacturing a semiconductor device according to claim 8, wherein said thin film forming step includes a step of forming said thin film within a film forming temperature range from 600° C. to 1,000° C.

11. A method for manufacturing a semiconductor device according to claim 7, wherein said first think film forming step includes a step of performing a heat treatment within a temperature range from 600° C. to 1,000° C. after forming said thin film.

12. A method for manufacturing a semiconductor device according to claim 8, wherein said thin film forming step includes a step of performing a heat treatment within a temperature range from 600° C. to 1,000° C. after forming said thin film.

13. The method for manufacturing a semiconductor device according claim to 1, wherein said implanting step comprises implanting ions at a dose rate of $9 \times 10^{13}$ ($cm^{-2}$) or less into said specified region of said semiconductor substrate.

14. The method for manufacturing a semiconductor device according claim to 2, wherein said implanting step comprises implanting ions at a dose rate of $9\times10^{13}$ (cm$^{-2}$) or less into said specified region of said semiconductor substrate.

15. The method for manufacturing a semiconductor device according claim to 3, wherein said implanting step comprises implanting ions at a dose rate of $9\times10^{13}$ (cm$^{-2}$) or less into said specified region of said semiconductor substrate.

16. The method for manufacturing a semiconductor device according claim to 4, wherein said implanting step comprises implanting ions at a dose rate of $9\times10^{13}$ (cm$^{-2}$) or less into said specified region of said semiconductor substrate.

17. The method for manufacturing a semiconductor device according claim to 5, wherein said implanting step comprises implanting ions at a dose rate of $9\times10^{13}$ (cm$^{-2}$) or less into said specified region of said semiconductor substrate.

18. The method for manufacturing a semiconductor device according claim to 6, wherein said implanting step comprises implanting ions at a dose rate of $9\times10^{13}$ (cm$^{-2}$) or less into said specified region of said semiconductor substrate.

19. The method for manufacturing a semiconductor device according claim to 7, wherein said implanting step comprises implanting ions at a dose rate of $9\times10^{13}$ (cm$^{-2}$) or less into said specified region of said semiconductor substrate.

20. The method for manufacturing a semiconductor device according claim 8, wherein said implanting step comprises implanting ions at a dose rate of $9\times10^{13}$ (cm$^{-2}$) or less into said specified region of said semiconductor substrate.

21. The method for manufacturing a semiconductor device according claim to 9, wherein said implanting step comprises implanting ions at a dose rate of $9\times10^{13}$ (cm$^{-2}$) or less into said specified region of said semiconductor substrate.

22. The method for manufacturing a semiconductor device according claim to 10, wherein said implanting step comprises implanting ions at a dose rate of $9\times10^{13}$ (cm$^{-2}$) or less into said specified region of said semiconductor substrate.

23. The method for manufacturing a semiconductor device according claim to 11, wherein said implanting step comprises implanting ions at a dose rate of $9\times10^{13}$ (cm$^{-2}$) or less into said specified region of said semiconductor substrate.

24. The method for manufacturing a semiconductor device according claim to 12, wherein said implanting step comprises implanting ions at a dose rate of $9\times10^{13}$ (cm$^{-2}$) or less into said specified region of said semiconductor substrate.

25. The method for manufacturing a semiconductor device according to claim 1, further comprising a step of heating the semiconductor substrate at a temperature in a range from 600° C. to 1,000° C. after the thermal oxide film forming step to thereby lower the interstitial oxygen concentration caused by the thermal oxide film forming step.

* * * * *